US007303849B2

(12) United States Patent
Tashiro

(10) Patent No.: US 7,303,849 B2
(45) Date of Patent: Dec. 4, 2007

(54) PLANOGRAPHIC PRINTING PLATE PRECURSOR

(75) Inventor: Hiroshi Tashiro, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 106 days.

(21) Appl. No.: 11/066,539

(22) Filed: Feb. 28, 2005

(65) Prior Publication Data

US 2005/0191577 A1 Sep. 1, 2005

(30) Foreign Application Priority Data

Feb. 27, 2004 (JP) ............................ 2004-055240

(51) Int. Cl.
*G03F 7/021* (2006.01)

(52) U.S. Cl. ...................... 430/156; 430/157; 430/175; 430/176; 430/302; 101/465

(58) Field of Classification Search ................ 430/156, 430/157, 175, 176, 302; 101/465
See application file for complete search history.

(56) References Cited

U.S. PATENT DOCUMENTS 6,140,005 A * 10/2000 Van Damme et al. ...... 430/156
6,727,031 B2 * 4/2004 Shimada et al. ............ 430/138

FOREIGN PATENT DOCUMENTS

| | | | |
|---|---|---|---|
| EP | 0 981 442 | B1 | 9/2003 |
| JP | 11-218914 | A | 8/1999 |
| JP | 2001-281856 | A | 10/2001 |
| WO | WO01-46318 | A1 | 6/2001 |

* cited by examiner

*Primary Examiner*—John S. Chu
(74) *Attorney, Agent, or Firm*—Sughrue Mion, PLLC

(57) ABSTRACT

A planographic printing plate precursor comprises a support and two or more positive recording layers which are formed on the support, contain a resin and an infrared absorbing agent and exhibit an increase in solubility in an aqueous alkali solution by exposure to infrared laser light, wherein the positive recording layer closest to the support among these two or more positive recording layers contains at least two types of resins among which at least one type forms a dispersion phase. It is preferable that the dispersion phase be formed of (1) a high-polymer compound incompatible with a high-polymer matrix or (2) a granular polymer selected from a microcapsule and a latex, and contains an infrared absorbing agent and an acid generator.

19 Claims, 1 Drawing Sheet

PLANOGRAPHIC PRINTING PLATE PRECURSOR

CROSS-REFERENCE TO RELATED APPLICATION

This application claims priority under 35 USC 119 from Japanese Patent Application No. 2004-055240, the disclosure of which is incorporated by reference herein.

BACKGROUND OF THE INVENTION

1. Field of the Invention

The present invention relates to a planographic printing plate precursor. More specifically, the invention relates to an infrared-laser-applicable planographic printing plate precursor for a so-called CTP (Computer To Plate), from which a printing plate can be directly formed based on digital signals from a computer or the like.

2. Description of the Related Art

The development of lasers for planographic printing in recent years has been remarkable. In particular, high-power, small-sized solid lasers and semiconductor lasers that emit near-infrared and infrared rays have become easily obtainable. These lasers are very useful as exposure light sources when forming printing plates directly from digital data of computers or the like.

Materials which can be used for positive type planographic printing plate precursors applicable for infrared lasers include, as essential components, a binder resin soluble in an aqueous alkaline solution (hereinafter referred to where appropriate as an "alkali-soluble resin"), and an infra red dye which absorbs light to generate heat. When an image is formed in a positive type planographic printing plate precursor, the infra red dye interacts with the binder resin in its unexposed portions (image portions) so as to function as a dissolution inhibitor which can substantially reduce the solubility of the binder resin. On the other hand, in its exposed portions (non-image portions), interaction of the infra red dye with the binder resin is weakened by the heat generated. Consequently, an exposed portion can turn into a state in which it can be dissolved in an alkaline developer, so that an image is formed thereon and a planographic printing plate is produced.

However, insofar as such infrared-laser-applicable positive planographic printing plate precursor materials are concerned, differences in the degree of resistance against dissolution in a developer between unexposed portions (image portions) and exposed portions (non-image portions) therein, that is, differences in development latitude have not yet been sufficient under various conditions of use. Thus, problems have occurred insofar that, with changes in conditions of use of materials, materials have tended to be either excessively developed or inadequately developed.

Further, when using an infrared-laser-applicable positive type planographic printing plate precursor, if the surface state of the unexposed portions of the plate precursor is slightly changed by human finger touching the surface or some other action, the affected unexposed portions (image portions) are dissolved by development to generate marks like scars. As a result, the plate precursor has problems in that the printing resistance thereof deteriorates and the ink-acceptability thereof worsens.

Such problems stem from fundamental differences in plate-making mechanisms between infrared-laser-applicable positive type planographic printing plate precursor materials and positive type planographic printing plate precursor materials from which printing plates are made up by exposure to ultra violet rays.

Specifically, positive type planographic printing plate precursor materials from which printing plates are made up by exposure to ultra violer rays each include, as essential components, a binder resin soluble in an aqueous alkaline solution and an onium salt, or a quinonediazide compound. This onium salt or quinonediazide compound not only interacts with the binder resin in unexposed portions (image portions) to function as a dissolution inhibitor, but in exposed portions (non-image portions) it is also decomposed by light and generates an acid to function as a dissolution promoter. In this way, the onium salt, or the quinonediazide compound, performs dual functions.

On the other hand, in infrared-laser-applicable positive type planographic printing plate precursor materials, the infra red dye functions only as a dissolution inhibitor of unexposed portions (image portions), and does not promote the dissolution of exposed portions (non-image portions). Therefore, in order to make distinctive the difference in solubility between the unexposed portion and the exposed portion in a positive planographic printing plate material for infrared laser, it is inevitable that a material which already has a high solubility in an alkali developing solution is used as the binder resin. It is therefore the case that the state of the plate material before developed becomes unstable.

Various proposals have been offered to solve the above problems. For example, a method has been proposed in which the distribution of an infrared absorbing agent is localized in the layer to improve the discrimination of an image (see, for example, the publication of Japanese Patent Application Laid-Open (JP-A) No. 2001-281856). Although there is improved discrimination by this method, the problem concerning scratch resistance on the surface of the recording layer has yet to be solved.

Also, a planographic printing plate precursor has been proposed which is provided with a recording layer, comprising a lower layer containing a sulfonamide type acryl resin, and an upper layer, which contains a water-insoluble and alkali-soluble resin and a photo-thermo converting agent, which is improved in solubility in an aqueous alkali solution by exposure to light (see, for example, the publication of JP-A No 11-218914). This type of planographic printing plate precursor produces the effect that, because the lower layer which is highly alkali-soluble is exposed when the recording layer is removed on an exposed portion, undesired residual film and the like are removed smoothly by an alkali developing agent. The lower layer also functions as an insulating layer, so that thermal diffusion to the support is efficiently suppressed. In the planographic printing plate precursor of this type, a method has been proposed in which a polymer is blended in the lower layer to provide chemical resistance (see, for example, a leaflet of International Publication (WO) No. 01/46318).

However, in order to form the multilayer structure, it is essential to select, as the resins used in both layers, those which differ in characteristics from each other, giving rise to the problem that the interaction between these resins may be reduced. Also, because the developing characteristics of the lower layer are so good, there is a possibility that an undesired dissolution phenomenon occurs at both end portions of the lower layer during developing, which adversely affects printing durability and image reproducibility. Therefore, there is ample room to make good use of the merits of a multilayer structure.

SUMMARY OF THE INVENTION

The present invention has been made in view of the above circumstances and provides a direct plate-making and positive planographic printing plate precursor for an infrared laser which is superior in scratch resistance and image discrimination.

The inventors of the invention have undertaken dedicated research and as a result, have found that the above problem can be addressed by: providing a positive recording layer having a multilayer structure; and forming a dispersion phase in which plural resins are dispersed in a recording layer close to a support. In so doing they have been able to complete the invention.

Accordingly, the invention provides a planographic printing plate precursor comprising a support and two or more positive recording layers which are formed on the support, contain a resin and an infrared absorbing agent and exhibit increased solubility in an aqueous alkali solution by exposure to infrared laser light, wherein the positive recording layer closest to the support among these two or more positive recording layers contains at least two types of resins among which at least one type forms a dispersion phase.

Hereinafter, "the positive recording layer closest to the support" is referred to as "a lower layer" or "a lower recording layer" as required in this specification.

It is to be noted that the planographic printing plate precursor of the invention may be provided with, besides the above plural positive recording layers, other layers on the support as long as the effect of the invention is not impaired. For example, a surface protective layer, an undercoat layer, an intermediate layer and/or a back coat layer.

The dispersion phase such as the above, may be formed, for example, by the following methods: (1) a method in which two types of resins which are incompatible with each other are used in combination, or (2) a method in which a granular polymer, selected from a microcapsule or a latex, is dispersed in a matrix resin.

Because a system utilizing a change in solubility of the recording layer in aqueous alkali is used in the planographic printing plate precursor of the invention, a resin used in the positive recording layer which contains a water-insoluble and aqueous alkali-soluble resin is a preferred aspect.

In the invention, the method (1), in which two types of resins which are incompatible with each other are used in combination to form a dispersion phase, is preferable from the viewpoint of ease of production. Resins which are incompatible with each other may be selected as these two types of resins. Also, the two types of resins may be those which are dissolved uniformly in a coating solvent, or those which form a dispersion phase along with removal of a solvent when the recording layer is formed.

Also, the lower recording layer such as above is preferably one in which among the aforementioned resins, the resin forming a matrix comprises a macromolecular compound, which is insoluble in water and soluble in an aqueous alkali solution, and the above dispersion phase contains a compound which generates an acid or a radical by irradiation with an infrared laser. Or the lower recording layer may be one in which among the aforementioned resins, the resin forming a matrix comprises a macromolecular compound which is insoluble in water and soluble in an aqueous alkali solution and the above dispersion phase contains a compound which is changed in alkali solubility by irradiation with infrared laser light.

As to the size of the dispersion phase, it is preferable that the maximum size be 0.1 to 0.8 μm and the average size be 0.05 to 0.6 μm. The evaluation of the size of the dispersion phase may be made in the following manner: a section of the photosensitive layer, obtained by cutting the recording layer using a microtome or the like, is made conductive; and then, a photograph of the section is taken by a scanning electron microscope (SEM) to analyze the size of a circular or elliptic dispersion phase using an image analyzer.

The planographic printing plate precursor of the invention is provided with a dispersion phase which is increased in solubility in an aqueous alkali solution by heat or light in the lower layer resin matrix phase. This ensures that in an exposed portion, the alkali solubility of the dispersion phase is increased, which is accompanied by the formation of a path in the matrix through which an aqueous alkali solution can penetrate. The result is that the dissolution of the alkali-soluble resin matrix in the lower layer of the exposed portion is promoted.

In an unexposed portion (image portion), on the other hand, the solubility of the dispersion phase itself in an alkali developing solution is low and therefore the penetrability of an aqueous alkali solution into the lower layer resin matrix, particularly penetration from the side, is restrained efficiently.

According to the planographic printing plate of the invention, damages to image portions caused by an aqueous alkali solution can be suppressed and it is therefore possible to form a sharp image with high discrimination.

This characteristics are conspicuous particularly in a highly precise image having a narrow image area and therefore the planographic printing plate precursor of the invention is especially useful for using with Frequency Modulated (FM) screens and the like, which provide high precision images and have been used increasingly along with recent developments of Computer to Plate (CTPs). Specifically, the planographic printing plate precursor of the invention may be preferably used for forming an image by using commercially available FM screens such as Staccato (trade name, manufactured by Creo), FAIRDOT and Randot (trade name, manufactured by Dainippon Screen Mfg. Co. Ltd.) and Co—Re Screen (trade name, Fuji Photo Film Co., Ltd.).

In short, the invention can provide a direct plate-making positive planographic printing plate precursor for infrared laser that is superior in scratch resistance and image discrimination. Therefore, the invention can improve plate-making stability in the case of, particularly, high precision images.

High precision images include FM screen images which have been used increasingly, along with recent developments of CTPs.

DETAILED DESCRIPTION OF THE INVENTION

Figure 1:
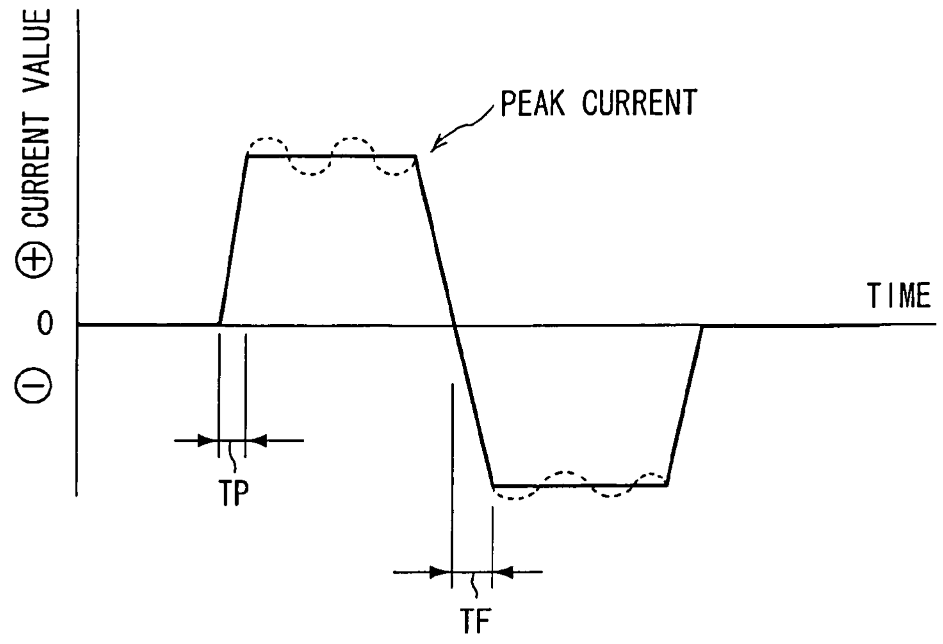
FIG. 1 is a graph showing one example of a waveform of alternate waveform current which is used for electrochemical surface roughing treatment in the production of a support used for a planographic printing plate precursor according to the invention.

The present invention will be hereinafter explained in detail.

The planographic printing plate precursor of the invention comprises a support and two or more positive recording layers which are formed on the support, contain a resin and an infrared absorbing agent and exhibit increased solubility in an aqueous alkali solution by exposure to infrared laser light, wherein the positive recording layer closest to the support among these two or more positive recording layers contains at least two types of resins among which at least one type forms a dispersion phase.

Specifically, the invention is characterized by the provision of the dispersion phase in the lower layer. The dispersion phase in the invention may be formed in the following two ways (1) and (2).

(1) Two or more types of resins (macromolecular compounds) which are incompatible with each other are used so that the resins and a mother material (matrix phase), i.e., a dispersion medium form a dispersion phase. In this case, a dispersion phase is formed of a material incompatible with the material of the dispersion medium.

(2) A microcapsule or a latex is used to form in advance a dispersion phase containing a specific component, and then the dispersion phase is introduced into a polymer binder, namely, a resin matrix phase. A dissolution inhibitor and an infrared absorbing agent may be added to the dispersion phase according to requirements.

As to a method of forming the dispersion phase, the dispersion phase obtained by the method (1) will be explained first.

Among two or more types of macromolecular compounds incompatible with each other, at least one macromolecular compound is insoluble in water and soluble in an aqueous alkali solution, and this is preferably the macromolecular compound forming the matrix phase.

Here, the term “incompatible with each other” means that a combination of two or more (types of) macromolecular compounds does not appear to be a single-phase in the solid or liquid state. This may be confirmed by processing a section or the like of the recording layer appropriately, taking a photograph of the section either visually or by using a scanning electron microscope and observing the image.

Examples of macromolecular compounds used for the combination of two or more macromolecular compounds include: urethane type macromolecular compounds; acryl type macromolecular compounds; styrene type macromolecular compounds; novolac resins; diazo resins; amide type macromolecular compounds and polyether compounds.

Examples of preferable combinations include: a combination of an acryl type macromolecular compound and a urethane type macromolecular compound; a combination of an acryl type or urethane type macromolecular compound and a diazo resin; and a combination of a novolac resin and a urethane type macromolecular compound. A combination containing a urethane type macromolecular compound is preferable from the viewpoint of providing resistance to damage during developing.

When the lower recording layer is formed in the presence of an infrared absorbing agent by using these two or more macromolecular compounds, a dispersion phase is formed in the macromolecular binder, and a large amount of the infrared absorbing agent is contained in the dispersion phase.

In the case of forming a binder layer by using two or more macromolecular compounds incompatible with each other, macromolecular compounds exhibiting strong interaction based on hydrogen bonding characteristics and ionic characteristics tend to form spherical shapes or flattened sphere shapes (namely, a dispersion phase) in the binder. On the other hand, the infrared absorbing agent is ionic or forms a complex configuration, and therefore is easily incorporated into such a macromolecular compound (dispersion phase) as described above which exhibits strong interaction in the binder. This gives rise to the aforementioned localization of the infrared absorbing agent in the dispersion phase.

Also, when an acid generator or a radical generator (polymerization initiator) is included together, as the initiator generally has a high polar group such as an onium salt structure, triazine or sulfonate, such an initiator is easily incorporated into the dispersion phase, as is the case with the infrared absorbing agent.

Here, when two or more types of incompatible macromolecular compounds are used to form the lower recording layer, if a dispersion phase is formed in a macromolecular matrix phase as the dispersion medium, this structure is referred to as an island structure. In the invention, the island structure can be observed and evaluated in the following manner: a section of the recording layer obtained by cutting the planographic printing plate precursor by a microtome or the like is made conductive and then an image of the section is taken by a scanning electron microscope (SEM) to analyze the size of a circular or elliptic dispersion phase using an image analyzer.

When the image taken is blurred, the section of the photosensitive layer is treated, for example, by etching with solvent and then a photograph of the section is taken according to the method described in, for example, “Polymer Alloy and Polymer Blend” (L. A. UTRACKI, translated by Toshio NISHI, Tokyo Kagaku Dojin), the disclosure of which is incorporated by reference herein, to thereby obtain a highly distinct image.

In such an island structure, the size of the dispersion phase existing in the macromolecular binder phase as the dispersion mother material depends on the coating solvent system and drying conditions after coating, and the like. Accordingly, a dispersion phase having a maximum diameter of 0.8 μm or less (preferably 0.6 μm or less) and an average of the maximum diamteter is 0.6 μm or less (preferably 0.5 μm or less) can be formed by controlling the aforementioned conditions.

The maximum diameter and the average of the maximum diameter described above are preferably small and there is no particular limitation to the lower limits of these sizes. In contrast, the maximum diameter is generally about 0.1 μm and the average thereof is about 0.05 μm. The maximum diameter is found by undertaking image analysis of the dispersion phase particles as described above, and represents the diameter in the case of a spherical particle, while the long axis in the case of an ellipsoidal particle.

The structural elements of the planographic printing plate precursor of the invention will be explained one after another in detail. First, the positive recording layer will be explained. The positive recording layer contains a water-insoluble and aqueous alkali-soluble macromolecular compound and a compound suppressing the alkali solubility. The solubility inhibiting ability of the latter compound is lost by exposure to infrared laser light so that the solubility of the former compound in an alkali developer is increased to thereby form an image.

(Alkali-Soluble Polymer)

In the invention, the water-insoluble and aqueous alkali-soluble macromolecular compound (hereinafter referred to as an alkali-soluble polymer as required) which is used in plural positive recording layers includes homopolymers having an acidic group on the principal chain and/or side chain of the polymer, copolymers thereof or mixtures of these polymers. The macromolecular layer according to the invention therefore has the characteristics that it is dissolved when it is brought into contact with an alkali developing solution.

Any known alkali-soluble polymer may be used as the alkali-soluble polymer to be used in the lower recording layer and other recording layers (hereinafter referred to as an upper recording layer as required) in the invention without any particular limitation. However, the alkali-soluble polymer is preferably a macromolecular compound having one functional group selected from (1) a phenolic hydroxyl group, (2) a sulfonamide group and (3) an active imide group in its molecule. The following compounds are given as examples: however, these examples are not intended to be limiting of the invention.

(1) Examples of the macromolecular compounds comprising phenolic hydroxyl group may include novolak resin such as condensation polymers of phenol and formaldehyde; condensation polymers of m-cresol and formaldehyde, condensation polymers of p-cresol and formaldehyde, condensation polymers of m-/p-mixed cresol and formaldehyde, and condensation polymers of phenol/cresol (m-, p-, or m-/p-mixture) and formaldehyde; and condensation copolymers of pyrogallol and acetone. As the macromolecular compound having a phenolic hydroxyl group, it is preferable to use macromolecular compounds having a phenolic hydroxyl group at their side chains besides the above compounds. Examples of the macromolecular compound having a phenolic hydroxyl group at its side chain include macromolecular compounds obtained by homopolymerizing a polymerizable monomer comprising a low-molecular compound having one or more phenolic hydroxyl groups and one or more polymerizable unsaturated bonds or copolymerizing this monomer with other polymerizable monomers.

Examples of the polymerizable monomer having a phenolic hydroxyl group include acrylamides, methacrylamides, acrylates and methacrylates each having a phenolic hydroxyl group or hydroxystyrenes. Specific examples of the polymerizable monomer which may be preferably used include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenylacrylate, m-hydroxyphenylacrylate, p-hydroxyphenylacrylate, o-hydroxyphenylmethacrylate, m-hydroxyphenylmethacrylate, p-hydroxyphenylmethacrylate, o-hydroxystyrene, m-hydroxystyrene, p-hydroxystyrene, 2-(2-hydroxyphenyl)ethylacrylate, 2-(3-hydroxyphenyl)ethylacrylate, 2-(4-hydroxyphenyl)ethylacrylate, 2-(2-hydroxyphenyl)ethylmethacrylate, 2-(3-hydroxyphenyl)ethylmethacrylate and 2-(4-hydroxyphenyl)ethylmethacrylate. Moreover, condensation polymers of phenols having an alkyl group having 3 to 8 carbon atoms as a substituent and formaldehyde, such as a t-butylphenol formaldehyde resin and octylphenol formaldehyde resin as described in the specification of U.S. Pat. No. 4,123,279 may be used together.

(2) Examples of the alkali-soluble macromolecular compound having a sulfonamide group include macromolecular compounds obtained by homopolymerizing polymerizable monomers having a sulfonamide group or by copolymerizing the monomer with other polymerizable monomers. Examples of the polymerizable monomer having a sulfonamide group include polymerizable monomers comprising a low-molecular compound having, in one molecule thereof, one or more sulfonamide groups —NH—$SO_2$— in which at least one hydrogen atom is added to a nitrogen atom and one or more polymerizable unsaturated bonds. Among these compounds, low-molecular compounds having an acryloyl group, allyl group or vinyloxy group and a substituted or monosubstituted aminosulfonyl group or substituted sulfonylimino group are preferable.

(3) The alkali-soluble macromolecular compound having an active imide group is preferably those having an active imide group in its molecule. Examples of the macromolecular compound include macromolecular compounds obtained by homopolymerizing a polymerizable monomer comprising a low-molecular compound having one or more active imide groups and one or more polymerizable unsaturated bonds or copolymerizing this monomer with other polymerizable monomers.

As such a compound, specifically, N-(p-toluenesulfonyl)methacrylamide, N-(p-toluenesulfonyl)acrylamide and the like are preferably used.

Moreover, as the alkali-soluble macromolecular compound of the invention, macromolecular compounds obtained by polymerizing two or more types among the aforementioned polymerizable monomers having a phenolic hydroxyl group, polymerizable monomers having a sulfonamide group and polymerizable monomers having an active imide group, or macromolecular compounds obtained by copolymerizing these two or more polymerizable monomers with other polymerizable monomers are preferably used. When a polymerizable monomer having a sulfonamide group and/or a polymerizable monomer having an active imide group is copolymerized with a polymerizable monomer having an active imide group, the ratio by weight of these components to be compounded is preferably in a range from 50:50 to 5:95 and particularly preferably in a range from 40:60 to 10:90.

When the alkali-soluble polymer is a copolymer of the aforementioned polymerizable monomer having a phenolic hydroxyl group, polymerizable monomer having a sulfonamide group or polymerizable monomer having an active imide group and other polymerizable monomers in the invention, it is preferable to contain a monomer imparting alkali-solubility in an amount of 10 mol % or more and more preferably 20 mol % or more. If the copolymer component is less than 10 mol %, the alkali-solubility tends to be unsatisfactory and there is the case where the effect of improving a developing latitude can be attained insufficiently.

Examples of the monomer component to be copolymerized with the aforementioned polymerizable monomer having a phenolic hydroxyl group, polymerizable monomer having a sulfonamide group and polymerizable monomer having an active imide group may include, though not particularly limited to, compounds represented by the following (m1) to (m12).

(m1) Acrylic acid esters and methacrylic acid esters having aliphatic hydroxyl groups such as 2-hydroxyethyl acrylate or 2-hydroxyethyl methacrylate.

(m2) Alkyl acrylate such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3) Alkyl methacrylate such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4) Acrylamide or methacrylamide such as acrylamide, methacrylamide, N-methylol acrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacxrylamide.

(m5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6) Vinyl esters such as vinyl acetate, vinyl chloroacetate, vinyl butylate, and vinyl benzoate.

(m7) Styrenes such as styrene, α-methylstyrene, methylstyrene, and chloromethylstyrene.

(m8) Vinyl ketones such as methyl vinyl ketone, ethyl vinyl ketone, propyl vinyl ketone, and phenyl vinyl ketone.

(m9) Olefins such as ethylene, propylene, isobutylene, butadiene, and isoprene.

(m10) N-vinylpyrrolidone, acrylonitrile, and methacrylonitrile.

(m11) Unsaturated imides such as maleimide, N-acryloylacrylamide, N-acetylmethacrylamide, N-propionylmethacrylamide, and N-(p-chlorobenzoyl)methacrylamide.

(m12) Unsaturated carboxylic acid such as acrylic acid, methacrylic acid, maleic anhydride, and itaconic acid.

The alkali-soluble macromolecular compound preferably comprises phenolic hydroxyl groups, in terms of the excellent image formability by exposure by infrared laser. Examples the alkali-soluble macromolecular compound comprising phenolic hydroxyl groups include condensed copolymers of phenol and formaldehyde comprising $C_3$-$C_8$ alkyl as a substitute, such as tert-butylphenol formaldehyde resin and octylphenol formaldehyde resin described in U.S. Pat. No. 4,123,279.

As a method of copolymerizing the aqueous alkali-soluble macromolecular compound, for example, a conventionally known graft copolymerization method, block copolymerization method or random copolymerization method may be used.

As the alkali-soluble polymer used in the upper recording layer, a resin having phenolic hydroxyl group is desirable in the point that it develops strong hydrogen bonding characteristics in an unexposed portion whereas a part of hydrogen bonds are released with ease in an exposed portion. The alkali-soluble polymer is more preferably a novolac resin. The alkali-soluble resin preferably has a weight average molecular weight of 500 to 20,000 and a number average molecular weight of 200 to 10,000.

A preferable method of forming a dispersion phase in the lower layer will be hereinafter explained.

In order to allow the dispersion phase constituting the island structure in the lower layer to have a maximum diameter of 0.8 μm or less and an average of the maximum diameter of 0.6 μm or less, the selection of the coating solvent is an important factor and therefore the use of a proper coating solvent system makes it possible to produce an island structure having an intended size (diameter).

A clear mechanism has not been found out as to the reason why the size of the dispersion phase is reduced or varied by the selection of a coating solvent system. A ketone type solvent such as cyclohexanone or methyl ethyl ketone, alcohol type solvent such as methanol, ethanol, propanol or 1-methoxy-2-propanol, cellosolve type solvent such as ethylene glycol monomethyl ether, lactone type solvent such as γ-butyrolactone, sulfoxide type such as dimethyl sulfoxide or sulfolane, halogen type solvent such as ethylene dichloride, acetate type solvent such as 2-methoxyethyl acetate or 1-methoxy-2-propyl acetate, ether solvent type such as dimethoxyethane, ester type solvent such as methyl lactate or ethyl lactate, amide type solvent such as N,N-dimethoxyacetamide or N,N-dimethylformamide, pyrrolidone type solvent such as N-methylpyrrolidone, urea type solvent such as tetramethylurea or aromatic type solvent such as toluene is preferably used as the coating solvent. Among these compounds, methyl ethyl ketone, 1-methoxy-2-propanol, ethylene glycol monomethyl ether, γ-butyrolactone and dimethyl sulfoxide are preferable. These solvents may be used either singly or by mixing two or more.

It is known that in addition to the aforementioned coating solvent type, the condition under which a coating layer that has not yet been dried (after the photosensitive coating solution is applied) is dried is an important factor to allow the dispersion phase constituting the island structure in the lower layer to have a specified size. The descriptions in the publication of JP-A No. 9-90610 may be adopted as a reference for the production of such an island structure.

The macromolecular compound used to form the dispersion phase in the case of forming the macromolecular matrix and the dispersion phase by using two or more macromolecular compounds incompatible with each other are shown below.

Examples of the macromolecular compound used in the invention include copolymers having a structural unit derived from at least one of monomers corresponding to the following (1) to (5), or urethane type macromolecular compounds, novolac resins, diazo resins and polyethers.

(1) Examples of the above structural unit include acrylamides, methacrylamides, acrylates and methacrylates having an aromatic hydroxyl group. Specific examples these compounds include N-(4-hydroxyphenyl)acrylamide or N-(4-hydroxyphenyl)methacrylamide, o-, p- or m-hydroxyphenylacrylate or methacrylate and 2-hydroxyethylmethacrylate.

(2) Examples of the above structural unit also include unsaturated carboxylic acids such as acrylic acid, methacrylic acid, maleic acid anhydride and itaconic acid.

(3) Examples of the above structural unit also include low-molecular compounds having at least one sulfonamide group in which at least one hydrogen atom is bonded to a nitrogen atom and at least one polymerizable unsaturated bond, for example, compounds represented by the following formulae (I) to (V).

General formula (I)

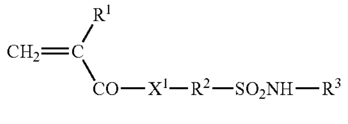

General formua (ii)

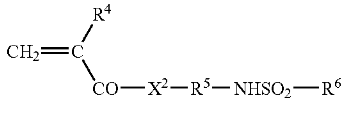

General formula (iii)

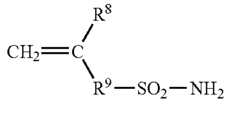

-continued

General formula (iv)

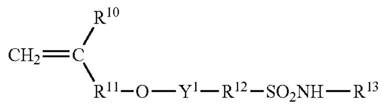

General formula (v)

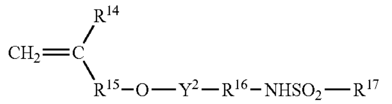

In the general formulae (i) to (v), $X^1$ and $X^2$ each independently represent —O—, or —$NR^7$—; $R^1$ and $R^4$ each independently represent a hydrogen atom, or —$CH_3$; $R^2$, $R^5$, $R^9$, $R^{12}$ and $R^{16}$ each independently represent an alkylene, cycloalkylene, arylene or aralkylene group which may have a substituent and has 1 to 12 carbon atoms; $R^3$, $R^7$ and $R^{13}$ each independently represent a hydrogen atom, or an alkyl, cycloalkyl, aryl or aralkyl group which may have a substituent and has 1 to 12 carbon atoms; $R^6$ and $R^{17}$ each independently represent an alkyl, cycloalkyl, aryl or aralkyl group which may have a substituent and has 1 to 12 carbon atoms; $R^8$, $R^{10}$ and $R^{14}$ each independently represent a hydrogen atom or —$CH_3$; $R^{11}$ and $R^{15}$ each independently represent a single bond, or an alkylene, cycloalkylene, arylene or aralkylene group which may have a substituent and has 1 to 12 carbon atoms; and $Y^1$ and $Y^2$ each independently represent a single bond or —CO—.

Specific examples of the compounds represented by the represented by the general formulae (i) to (v) include m-aminosulfonylphenyl methacrylate, N-(p-aminosulfonylphenyl) methacrylamide and N-(p-aminosulfonylphenyl) acrylamide.

(4) Examples of the above structural unit also include low-molecular compounds containing at least one active imino group represented by the following formula (VI) and at least one polymerizable unsaturated bond, for example, N-(p-toluenesulfonyl)methacrylamide and N-(p-toluenesulfonyl)acrylamide.

(VI)

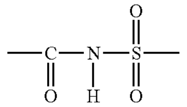

(5) Examples of the above structural unit also include styrene type compounds or vinyl acetate and vinyl alcohol, for example, o-, m- or p-hydroxystyrene, styrene p-sulfonate and o-, m- or p-carboxylstyrene.

The monomers corresponding to the above (1) to (5) may be used either singly or in combinations of two or more. Copolymers obtained by combining these monomers (1) to (5) with monomers other than these monomers (1) to (5) are more preferable. In this case, the structural unit derived from the above monomers (1) to (5) is contained in an amount 10 mol % or more, preferably 20 mol % or more and still more preferably 25 mol % or more. Examples of the monomer used in combination with these monomers (1) to (5) include the following compounds (6) to (16).

(6) Acrylates and methacrylates having an aliphatic hydroxyl group, for example, 2-hydroxyethylacrylate or 2-hydroxyethylmethacrylate.

(7) (Substituted) alkylacrylates such as methylacrylate, ethylacrylate, propylacrylate, butylacrylate, amylacrylate, hexylacrylate, octylacrylate, benzylacrylate, 2-chloroethylacrylate, glycidylacrylate and N-dimethylaminoethylacrylate.

(8) (Substituted) alkylmethacrylates such as methylmethacrylate, ethylmethacrylate, propylmethacrylate, butylmethacrylate, amylmethacrylate, hexylmethacrylate, cyclohexylmethacrylate, benzylmethacrylate, glycidylmethacrylate and N-dimethylaminoethylmethacrylate.

(9) Acrylamide or methacrylic acid amides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide.

(10) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(11) Vinyl esters such as vinyl acetate, vinyl chloroacetate, vinyl butyrate and vinyl benzoate.

(12) Styrenes such as styrene, α-methylstyrene, methylstyrene and chloromethylstyrene.

(13) Vinyl ketones such as methyl vinyl ketone, ethyl vinyl ketone, propyl vinyl ketone and phenyl vinyl ketone.

(14) Olefins such as ethylene, propylene, isobutylene, butadiene and isoprene.

(15) N-vinylpyrrolidone, N-vinylcarbazole, 4-vinylpyridine, acrylonitrile and methacrylonitrile.

(16) Unsaturated imides such as maleimide, N-acryloylacrylamide, N-acetylmethacrylamide, N-propionylmethacrylamide and N-(p-chlorobenzoyl)methacrylamide.

Furthermore, monomers polymerizable with the above monomers may be copolymerized. As these macromolecular compounds, those having a weight average molecular weight of 2000 or more and a number average molecular weight of 1000 or more are preferably used. The macromolecular compound is more preferably those having a weight average molecular weight of 5000 to 300000, a number average molecular weight of 2000 to 250000 and a degree of dispersion (weight average molecular weight/number average molecular weight) of 1.1 to 10.

Examples of the water-insoluble and aqueous alkali solution-soluble urethane type macromolecular compound include, though not limited to, urethane type macromolecular compounds described in each publication of JP-A Nos. 63-124047, 63-287946, 2-866 and 2-156241.

In the invention, the above acryl type macromolecular compound may be used together with the urethane macromolecular compound.

Examples of the alkali-soluble novolac resin used in the invention may include alkali-soluble novolac resins such as a phenolformaldehyde resin, m-cresolformaldehyde resin, p-cresolformaldehyde resin, m-/p-mixed cresolformaldehyde resin and phenol/cresol (any of m-, p- and m-/p-mixture) mixed formaldehyde resin. As these alkali-soluble novolac resins, those having a weight average molecular weight of 500 to 20000 and a number average molecular weight of 200 to 10000 are used. Further, a condensate of a phenol having an alkyl group having 3 to 8 carbon atoms as a substituent and formaldehyde such as a t-butylphenolformaldehyde resin and octylphenolformaldehyde resin may be used together.

Also, as the diazo resin used in the invention, a diazo resin, namely, a polymer or oligomer having a diazonium group as its side chain is preferably used. Particularly, diazo resins which are condensates of aromatic diazonium salts and, for example, active carbonyl-containing compounds (e.g., formaldehyde) are useful. Preferable examples of the diazo resin include reaction products of anions and condensates obtained by condensing the following diazo monomers with a condensing agent such as formaldehyde, acetaldehyde, propionaldehyde, butylaldehyde, isobutylaldehyde and benzaldehyde in ratio by mol of 1:1 to 1:0.5 and preferably 1:0.8 to 1:0.6 by using a usual method: examples of the aforementioned diazo monomers include 4-diazodiphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, 1-diazo-2,5-dibutoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine and 3-isopropoxy-4-diazodiphenylamine.

Examples of the anions may include boron tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, di-t-butylnaphthalenesulfonic acid, 1-naphthol-5-sulfonic acid, 2-methoxy-4-hydroxy-5-benzoyl-benzenesulfonic acid and paratoluenesulfonic acid. Among these compounds, hexafluorophosphoric acid and alkyl aromatic sulfonic acids such as triisopropylnaphthalenesulfonic acid and 2,5-dimethylbenzenesulfonic acid are particularly preferable.

Also, reaction products between the aforementioned anions and condensates obtained from the aforementioned diazomonomers and carboxylic acids and/or aldehydes having a phenol or its acetal (and further the aforementioned condensing agents according to the need) and diazo resins as described in each publication of JP-A Nos. 1-102456 and 1-102457 are preferably used in the invention. Particularly, the diazo resins containing a carboxylic acid group are preferable because they improve developing characteristics with the result that a non-image portion when carrying out printing is scarcely soiled.

Among these diazo resins, diazo resins which have the structural unit represented by the following formula (1) or the structural unit represented by the following formulae (1) and (2) and a weight average molecular weight of 500 or more, preferably 800 or more and more preferably 1000 or more are most preferable from the viewpoint that the decomposability of these resins and the preserving stability of the resulting planographic printing plate precursor are both good. When the weight average molecular weight is less than 500, the layer strength of an image portion is reduced. The ratio (weight ratio) of the structural units represented by the formulae (1) and (2) is preferably 100:0 to 30:70. If the amount of the structural unit represented by the formula (1) is reduced, the strength of an image portion is reduced. The diazo resin used in the invention may contain other structure unit.

(1)

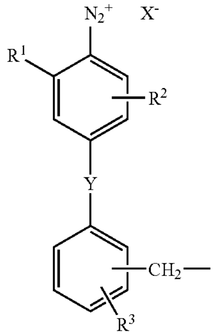

(2)

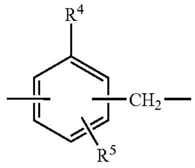

wherein $R^1$, $R^2$, $R^3$, $R^4$ and $R^5$ respectively represent hydrogen, a halogen (for example, fluorine, chlorine or bromine), —COOH, —$OPO_3H_2$, —$PO_3H_2$, —$SO_3H$, —OH, a hydrocarbon group which may have a substituent (for example, —COOH, —$OPO_3H_2$, —$PO_3H_2$, —$SO_3H$ or —OH) (for example, a carboxymethyl group, a hydroxyethyl group or a p-carboxymethoxyphenyl group), an alkoxy group (for example, a methoxy group, a hexyloxy group or a carboxymethoxy group) or an aryloxy group (for example, a phenoxy group or a p-carboxymethoxyphenoxy group), Y represents $NR^6$, O or S, $R^6$ represents hydrogen or a hydrocarbon group having 12 or less carbon atoms (for example, a methyl group, an ethyl group or a hexyl group). Also, $X^-$ represents $PF_6^-$ or a benzene sulfonate or a naphthalene sulfonate which may have a substituent having 20 or less carbon atoms. Examples of the substituent include a methyl group, butyl group (including n-, i-, sec- or t-butyl group), hexyl group, decyl group, dodecyl group and benzoyl group.

The lower recording layer comprising a macromolecular matrix containing a dispersion phase formed in this manner, when it is a positive recording layer, contains an infrared absorbing agent and a compound which is changed in solubility in an aqueous alkali solution by heat, in a high content in the dispersion phase, to thereby improve the solubility of the macromolecular matrix layer in an aqueous alkali.

Next, the dispersion phase (2) of the invention will be explained. In the granular polymer such as a microcapsule or latex which is used in the invention, the microcapsule can be easily prepared by the method described in the examples of the publication of JP-A No. 1-145190 or the method described in "NEW EDITION, MICROCAPSULE-ITS PREPARATION, NATURE AND APPLICATION" published by Sankyo Shuppan. As to the latex, the latex or production method in each publication of JP-A Nos. 10-265710, 10-270233 and 5-2281 and "CHEMISTRY OF MACROMOLECULAR LATEX" issued from Polymer Publishing Association and "MACROMOLECULAR LATEX" published by New Polymer Library may be used to prepare the latex used in the invention.

At this time, examples of materials included in the capsule or in the latex include an acid generator, initiator such as a radical generator, light-heat converting material or a crosslinking agent. Also, as the macromolecular compound which may be used as the macromolecular matrix for layer formation in the lower layer having the dispersion phase (2), the compounds exemplified in the aforementioned embodiment of the dispersion phase (1) may be likewise used.

Next, each compound contained in the dispersion phase will be explained.

The dispersion phase may include an acid generator that is decomposed by light or heat to generate an acid, to improve the solubility of the aqueous alkali-soluble macromolecular compound of an exposed portion in aqueous alkali.

The acid generator represents those that are decomposed by irradiation with light having a wavelength of 200 to 500 nm or by heating at 100° C. or more. Examples of the acid generator include a photoinitiator for photo-cationic polymerization, photoinitiator for photo-radical polymerization, photo-achromatizing agent for dyes, photo-discoloring agent, known acid generator used for micro-resist, known compound which is thermally decomposed to generate an acid and a mixture of these compounds. As the acid to be generated is preferably a strong acid having a pKa of 2 or less such as sulfonic acid and hydrochloric acid.

Preferable examples of the initiator include the triazine compounds described in the publication of JP-A No. 11-95415 and the latent Bronsted acid described in the publication of JP-A No. 7-20629. Here, the latent Bronsted acid means a precursor that is to be decomposed to generate a Bronsted acid. It is assumed that the Bronsted acid catalyzes a matrix generating reaction between a resol resin and a novolac resin. Typical examples of the Bronsted acid fitted to this purpose include trifluoromethanesulfonic acid and hexafluorophosphonic acid.

An ionic latent Bronsted acid may be preferably used in the invention. Examples of the ionic latent Bronsted acid include onium salts, particularly, iodonium, sulfonium, phosphonium, selenonium, diazonium and arsonium salts. Particularly useful and specific examples of the onium salt include diphenyliodonium hexafluorophosphate, triphenylsulfonium hexafluoroantimonate, phenylmethyl-ortho-cyanobenzylsulfoniumtrifluoromethane sulfonate and 2-methoxy-4-aminophenyldiazonium hexafluorophosphate.

Nonionic latent Bronsted acids are also appropriately used in the invention. Examples of these nonionic latent Bronsted acids include compounds represented by the following formula:

$RCH_2X$, $RCHX_2$, $RCX_3$, $R(CH_2X)_2$ and $R(CH_2X)_3$ (wherein X represents Cl, Br, F or $CF_3SO_3$ and R represents an aromatic group, an aliphatic group or a combination of an aromatic group and an aliphatic group).

Useful ionic latent Bronsted acid is those represented by the following formula.

$$X^+R^1R^2R^3R^4\ W^-$$

In the formula, $R^3$ and $R^4$ respectively represent a lone electron pair and $R^1$ and $R^2$ respectively represent an aryl or substituted aryl group when X is iodine. When X is S or Se, $R^4$ represents a lone electron pair and $R^1$, $R^2$ and $R^3$ respectively represent an aryl group, a substituted aryl group, an aliphatic group or substituted aliphatic group. When X is P or As, $R^4$ represents an aryl group, a substituted aryl group, an aliphatic group or a substituted aliphatic group. W represents $BF_4$, $CF_3SO_3$, $SbF_6$, $CCl_3CO_2$, $ClO_4$, $AsF_6$, $PF_6$ or may be any corresponding acid having a pH less than 3. All the onium salts described in the specification of U.S. Pat. No. 4,708,925 may be used as the latent Bronsted acid used in the invention. Examples of these onium salts include indonium, sulfonium, phosphonium, bromonium, chloronium, oxysulfoxonium, oxysulfonium, sulfoxonium, selenonium, telluronium and arsonium.

It is particularly preferable to use a diazonium salt as the latent Bronsted acid. These diazonium salts provide a sensitivity equivalent to that of other latent Bronsted acids in the infrared region and a higher sensitivity than other latent Bronsted acid in the ultraviolet region.

In the invention, these acid generators are added in a proportion of 0.01 to 50% by weight, preferably 0.1 to 25% by weight and more preferably 0.5 to 20% by weight from the viewpoint of image forming characteristics and from the viewpoint of preventing a non-image portion from being contaminated.

The positive recording layer in the invention contains an infrared absorbing agent that is a structural component developing a light-heat converting function. This infrared absorbing agent has the ability to convert absorbed infrared rays into heat. Laser scanning causes the infrared absorbing agent to lose the interaction, a developing inhibitor to decompose and generates an acid, which significantly improves the solubility of the infrared absorbing agent. Also, there is also the case where the infrared absorbing agent itself interacts with the alkali-soluble resin to suppress alkali-solubility.

It is considered that the inclusion of such an infrared absorbing agent within the dispersion phase of the lower layer results in the localization of the infrared absorbing agent in the dispersion phase, and resultantly promotes interaction releasability and improves the ability to decompose an acid generator when this acid generator is contained.

The infrared absorbing agent used in the invention is dyes or pigments which efficiently absorb infrared rays having a wavelength from 760 nm to 1200 nm and is preferably dyes or pigments having an absorption maximum in a wavelength range from 760 nm to 1200 nm.

The infrared absorbing agent which can be used preferably for the planographic printing plate precursor of the invention will be hereinafter explained in detail.

The dyes may be commercially available ones and known ones described in publications such as "Dye Handbook" (edited by the Society of Synthesis Organic Chemistry, Japan, and published in 1970). Specific examples thereof include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium dyes, metal thiolate complexes, oxonol dyes, diimonium dyes, aminium dyes, and croconium dyes.

Preferable examples of the dye include cyanine dyes described in JP-A Nos. 58-125246, 59-84356, 59-202829, and 60-78787; methine dyes described in JP-A Nos. 58-173696, 58-181690, and 58-194595; naphthoquinone dyes described in JP-A Nos. 58-112793, 58-224793, 59-48187, 59-73996, 60-52940, and 60-63744; squalirium dyes described in JP-A No. 58-112792; and cyanine dyes described in GB Patent No. 434,875.

Other preferable examples of the dye include near infrared absorbing sensitizers described in U.S. Pat. No. 5,156,938; substituted arylbenzo(thio)pyrylium salts described in U.S. Pat. No. 3,881,924; trimethinethiapyrylium salts described in JP-A No. 57-142645 (U.S. Pat. No. 4,327,169); pyrylium type compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283,475; and pyrylium compounds described in Japanese Patent Application Publication (JP-B) Nos. 5-13514 and 5-19702.

Additional preferable examples of the dye include near infrared absorbing dyes represented by formulae (I) and (II) as described in U.S. Pat. No. 4,756,993.

Among these dyes, particularly preferable are cyanine dyes, phthalocyanine dyes, oxonol dyes, squalirium dyes, pyrylium salts, thiopyrylium dyes, and nickel thiolate complexes.

The pigment used as the infrared absorbent in the invention may be a commercially available pigment or a pigment described in publications such as Color Index (C.I.) Handbook, "Latest Pigment Handbook" (edited by Japan Pigment Technique Association, and published in 1977), "Latest Pigment Applied Technique" (by CMC Publishing Co., Ltd. in 1986), and "Printing Ink Technique" (by CMC Publishing Co., Ltd. in 1984).

Examples of the pigment include black pigments, yellow pigments, orange pigments, brown pigments, red pigments, purple pigments, blue pigments, green pigments, fluorescent pigments, metal powder pigments, and polymer-bonded dyes. Specifically, the following can be used: insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black. Among these pigments, carbon black is preferable.

These pigments may be used with or without surface treatment. Examples of surface treatment include a method of coating the surface of the pigments with resin or wax; a method of adhering a surfactant onto the surface; and a method of bonding a reactive material (such as a silane coupling agent, an epoxy compound, or a polyisocyanate) to the pigment surface. The surface treatment methods are described in "Nature and Application of Metal Soap" (Saiwai Shobo), "Printing Ink Technique" (by CMC Publishing Co., Ltd. in 1984). And "Latest Pigment Applied Technique" (by CMC Publishing Co., Ltd. in 1986.

The particle size of the pigment is preferably from 0.01 to 10 μm, more preferably from 0.05 to 1 μm, and even more preferably from 0.1 to 1 μm. When a particle size is within the preferable range, a superior dispersion stability of the pigment in the photosensitive composition can be obtained, whereby, when the photosensitive composition of the invention is used for a recording layer of the photosensitive printing plate precursor, it is possible to form a homogeneous recording layer.

The method for dispersing the pigment may be a known dispersing technique used to produce ink or toner. Examples of a dispersing machine, which can be used, include an ultrasonic disperser, a sand mill, an attriter, a pearl mill, a super mill, a ball mill, an impeller, a disperser, a KD mill, a colloid mill, a dynatron, a three-roll mill, and a pressing kneader. Details are described in "Latest Pigment Applied Technique" (by CMC Publishing Co., Ltd. in 1986).

In the case of a positive recording layer like this, the infrared absorbing agent is preferably a dye. Particularly preferable examples of the dye include infrared absorbing agents having an onium salt structure as described in the publication of JP-A No. 11-291652, Paragraphs No. [0018] to [0034].

The planographic printing plate precursor of the invention has a positive recording layer. It is therefore preferable to use an infrared absorbing agent which causes a positive action (solubility of an unexposed portion in an alkali developer is suppressed and the suppression of the solubility is cancelled in an exposed portion) by an interaction with a binder polymer having a specific functional group and infrared absorbing agents having an onium salt type structure are particularly preferable in this point. Specifically, among the aforementioned absorbers, cyanine dyes and pyrylium salts are particularly preferable. The details of these cyanine dyes and pyrylium salts are as mentioned above.

Moreover, an anionic infrared absorbing agent as described in Japanese Patent Application No. 10-237634 is also preferably used. This anionic infrared absorbing agent represents those having no cationic structure but an anionic structure on the mother nucleus of a dye which substantially absorbs infrared rays.

Examples of the anionic infrared absorbing agent include (a-1) anionic metal complexes and (a-2) anionic phthalocyanines.

Here, the anionic metal complex (a-1) represents those in which the core metal and the ligands in the complex part that substantially absorbs light are an anion as a whole.

The anionic phthalocyanine (a-2) are those in which an anionic group such as a sulfonic acid, carboxylic acid or phosphonic acid group is bonded as a substituent with a phthalocyanine skeleton to form an anion as a whole.

Other examples of the anionic phthalocyanine may include anionic infrared absorbing agents represented by the formula $[Ga^{-}\text{-M-}Gb]_m X^{m+}$ (Ga represents an anionic substituent, $Gb^{-}$ represents a neutral substituent. $X^{m+}$ represents a cation having a valency of 1 to m (where m denotes an integer from 1 to 6) including a proton) as described in Japanese Patent Application of No. 10-237634, Paragraphs [0014] to [0105].

The infrared absorbing agent used in the positive recording layer is preferably a dye. Preferable examples of the dye include infrared absorbing agents having an onium salt structure as described in the publication of JP-A No. 11-291652, Paragraphs [0018] to [0034].

Besides the infrared absorbing agent, such as the aforementioned cyanine dye, pyrylium salt and anionic dye, which develop dissolution inhibitive ability, other dyes or pigments may be used together in the recording layer according to the invention, to further improve sensitivity and developing latitude.

In the invention, the infrared absorbing agent is preferably added in an amount of 0.01 to 50% by weight, more preferably 0.1 to 20% by weight and more preferably 0.5 to 15% by weight based on the total solid content in each of the lower recording layer and other recording layers from the viewpoint of image formation characteristics and from the viewpoint of suppressing contamination to a non-image portion.

The infrared absorbing agent may be contained in any of the matrix phase and the dispersion phase or in the both. When desired components such as the initiator and infrared absorbing agent are contained in the latex constituting the aforementioned dispersion phase, the infrared absorbing agent may be added together with the raw materials when the latex particles are formed or may be introduced after the latex is formed.

Examples of the method of introducing the infrared absorbing agent after the latex is formed include a method in which desired components such as the initiator, color systems and crosslinking agent to be introduced in the latex dispersed in a water system are dissolved in an organic solvent, which is then added in the dispersion medium.

It is necessary as mentioned above that the recording layer of the planographic printing plate precursor of the invention is highly resistant to abrasion in relation to an infrared laser irradiation system. Any macromolecular material may be used as the macromolecular material which is the binder constituting the recording layer insofar as it is changed in solubility in an aqueous alkali, namely, an alkali developing solution by imparting thermal energy. It is preferable to use a polymer insoluble in water and soluble in aqueous alkali from the viewpoint of availability and resistance to abrasion.

The ceiling temperature of the polymer is given as an example of an index of the abrasion resistance. This ceiling temperature is a temperature at which the rate of a polymerization reaction is equal to the rate of a depolymerization reaction. It is preferable to select polymers having a high ceiling temperature to obtain high abrasion resistance. As a simple method, a proper polymer may be selected using the decomposition temperature thereof as an index.

In the invention, the polymer constituting the recording layer is a polymer having a decomposition temperature of preferably 150° C. or more and more preferably 200° C. or more. When the decomposition temperature is less than 150° C., this is not preferable because the possibility of abrasion is increased.

Also, each component other than the macromolecular compound contained in the recording layer preferably has a decomposition temperature of 150° C. or more. However, as to components contained in a small amount, those having a decomposition temperature less than 150° C. may be used to the extent that the addition of these components gives rise to no substantial problem.

In the recording layer of the planographic printing plate precursor of the invention, various known additives may be combined with the aforementioned structural components according to the object. It is necessary to form the dispersion phase in the lower recording layer among plural recording layers. However, as to other additives, the same ones may be used in the lower recording layer and other recording layers.

[Fluorine-Containing Polymer]

Each recording layer of the invention is preferably compounded of a fluorine polymer for the purpose of improving the developing durability in an image part region. Examples of the fluorine-containing polymer used in an image recording layer include fluorine-containing monomer copolymers as described in each publication of JP-A Nos. 11-288093 and 2000-187318. Preferable and specific examples of the fluorine-containing polymer include fluorine-containing acryl type polymers P-1 to P-13 as described in the publication of JP-A No. 11-288093 and fluorine-containing polymers obtained by copolymerizing fluorine-containing acryl type monomers A-1 to A-33 with optional acryl monomers.

As to the molecular weight of the fluorine-containing polymer exemplified above, a fluorine-containing polymer having a weight average molecular weight of 2000 or more and a number average molecular weight of 1000 or more is preferably used. It is more preferable that the weight average molecular weight be 5000 to 300000 and the number average molecular weight be 2000 to 250000.

Also, as the fluorine-containing polymer, commercially available fluorine type surfactants having the aforementioned preferable molecular weight may be used. Specific examples of these surfactants may include Megafac F-171, F-173, F-176, F-183, F-184, F-780 and F-781 (all are trade names).

These fluorine-containing polymers may be used either singly or combinations of two or more.

It is necessary that the amount of the fluorine-containing polymer be 1.4 mass % or more based on the solid content of the image recording layer to meet the requirements in the invention. The amount is preferably 1.4 to 5.0 mass %. When the amount is below 1.4 mass %, the purpose of the addition of the fluorine-containing polymer, namely, the effect of improving the developing latitude of the image recording layer is obtained insufficiently. Even if the fluorine-containing polymer is added in an amount exceeding 5.0 mass %, the effect of bettering the developing latitude is not improved; on the contrary, the solubility of the surface of the image recording layer is made more sparing by the influence of the fluorine-containing polymer and there is a possibility of a decrease in sensitivity.

(Dissolution Inhibitor)

A material (dissolution inhibitor), such as an onium salt, o-quinonediazide compound, aromatic sulfone compound or aromatic sulfonate compound, which is thermally decomposable and substantially reduces the solubility of the aqueous alkali-soluble macromolecular compound in an decomposed state may be added together according to the need in the lower recording layer or other layers according to the invention. The addition of the dissolution inhibitor makes it possible not only to improve the dissolution resistance of the image portion in a developing solution but also to use, as the infrared absorbing agent, a compound which does not interact with the alkali-soluble resin. Examples of the onium salt include diazonium salts, ammonium salts, phosphonium salts, iodonium salts, sulfonium salts, selenonium salts and arsonium salts.

Preferable examples of the onium salt used in the invention include diazonium salts described in S. I. Schlesinger, Photogr. Sci. Eng., 18, 387 (1974), T. S. Bal et al., Polymer, 21, 423 (1980), and JP-A No. 5-158230; ammonium salts described in U.S. Pat. Nos. 4,069,055 and 4,069,056, and JP-A No. 3-140140; phosphonium salts described in D. C. Necker et al., Macromolecules, 17, 2468 (1984), C. S. Wen et al., Teh, Proc. Conf. Rad. Curing ASIA, p478 Tokyo, Oct (1988), and U.S. Pat. Nos. 4,069,055 and 4,069,056; iodonium salts described in J. V. Crivello et al., Macromolecules, 10 (6), 1307 (1977), Chem. & Eng. News, Nov. 28, p31 (1988), EP No. 104,143, U.S. Pat. Nos. 5,041,358 and 4,491,628, and JP-A Nos. 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP Nos. 370,693, 233,567, 297,443 and 297,442, U.S. Pat. Nos. 4,933,377, 3,902,114, 5,041,358, 4,491,628, 4,760,013, 4,734,444 and 2,833,827, and DE Patent Nos. 2,904,626, 3,604,580 and 3,604,581; selenonium salts described in J. V. Crivello et al., Macromolecules, 10 (6), 1307 (1977), J. V. Crivello et al., J. Polymer Sci., Polymer Chem. Ed., 17, 1047 (1979); arsonium salts described in C. S. Wen et al., and The Proc. Conf. Rad. Curing ASIA, p478, Tokyo, Oct (1988).

In the invention, a diazonium salt is particularly preferable. Particularly preferable diazonium salts include those described in the publication of JP-A No. 5-158230.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and p-toluenesulfonic acid. Among these examples, hexafluorophosphoric acid, and alkylaromatic sulfonic acids such as triisopropylnaphthalenesulfonic acid and 2,5-dimethylbezenesulfonic acid are particularly preferable.

The quinonediazide is preferably an o-quinonediazide compound. The o-quinonediazide compound used in the invention is a compound having at least one o-quinonediazide group and having an alkali-solubility increased by being thermally decomposed. The compound may be any one of compounds having various structures.

In other words, the o-quinonediazide compound assists the solubility of the photosensitive material both from the viewpoint of the effects of being thermally decomposed, and thereby losing the function of suppressing the dissolution of the binder, and the effect that the o-quinonediazide itself is changed into an alkali-soluble material.

Preferable examples of the o-quinonediazide compound used in the invention include compounds described in J. Coser, "Light-Sensitive Systems" (John Wiley & Sons. Inc.), pp. 339-352. Particularly preferable are sulfonic acid esters or sulfonamides of o-quinonediazide made to react with various aromatic polyhydroxy compounds or with aromatic amino compounds.

Further preferable examples include an ester made from benzoquinone-(1,2)-diazidesulfonic acid chloride or naphthoquinone-(1,2)-diazide-5-sulfonic acid chloride and pyrogallol-acetone resin, as described in JP-B No. 43-28403; and an ester made from benzoquinone-(1,2)-diazidesulfonic acid chloride or naphthoquinone-(1,2)-diazide-5-sulfonic acid chloride and phenol-formaldehyde resin.

Additional preferable examples include an ester made from naphthoquinone-(1,2)-diazide-4-sulfonic acid chloride and phenol-formaldehyde resin or cresol-formaldehyde resin; and an ester made from naphthoquinone-(1,2)-diazide-4-sulfonic acid chloride and pyrogallol-acetone resin.

Other useful o-quinonediazide compounds are reported in unexamined or examined patent documents, examples of which include JP-A Nos. 47-5303, 48-63802, 48-63803, 48-96575, 49-38701 and 48-13354, JP-B No. 41-11222, 45-9610 and 49-17481, U.S. Pat. Nos. 2,797,213, 3,454,400, 3,544,323, 3,573,917, 3,674,495 and 3,785,825, GB Patent Nos. 1,227,602, 1,251,345, 1,267,005, 1,329,888 and 1,330,932, and DE Patent No. 854,890.

The amount of the o-quinonediazide compound is preferably in a range from 1 to 50 mass %, more preferably in a range from 5 to 30 mass % and particularly preferably in a range from 10 to 30 mass % based on the total solid content of each recording layer. These compounds may be used as a mixture of plural types though each may be used singly.

The amount of the additives except for o-quinonediazide compound is preferably 1 to 50 mass %, more preferably 5 to 30 mass % and particularly preferably 10 to 30 mass %. The additives and binder used in the invention are preferably compounded in the same layer.

Also, a polymer using, as a polymer component, a (meth) acrylate monomer having two or three perfluoroalkyl group having 3 to 20 carbon atoms in its molecule as described in the specification of JP-A No. 2000-87318 may be used together for the purpose of intensifying the discrimination of an image and increasing resistance to surface damages.

In order to enhance sensitivity, the photosensitive composition may also contain a cyclic acid anhydride, a phenolic compound, or an organic acid.

Examples of cyclic acid anhydride include phthalic anhydride, tetrahydrophthalic anhydride, hexahydrophthalic anhydride, 3,6-endooxy-Δ4-tetrahydrophthalic anhydride, tetrachlorophthalic anhydride, maleic anhydride, chloromaleic anhydride, α-phenylmaleic anhydride, succinic anhydride, and pyromellitic anhydride which are described in U.S. Pat. No. 4,115,128.

Examples of phenolic compound include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane.

Examples of the organic acid include sulfonic acids, sulfonic acids, alkylsulfuric acids, phosphonic acids, phosphates, and carboxylic acids, which are described in JP-A No. 60-88942 or 2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

When the cyclic acid anhydride, the phenol or the organic acid is added to the printing plate material (the recording layer) of a planographic printing plate precursor, the ratio thereof in the recording layer is preferably from 0.05 to 20%, more preferably from 0.1 to 15%, and even more preferably from 0.1 to 10% by mass.

For example, a dye having absorption in the visible light region may be added as a colorant for an image to each recording layer according to the invention. Examples of the dye may include Oil Yellow #101, Oil Yellow #103, Oil Pink #312, Oil Green BG, Oil Blue BOS, Oil Blue #603, Oil Black BY, Oil Black BS and Oil Black T-505 (these products are manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015) and Aizen Spirol Blue C-RH (manufactured by Hodogaya Chemical Co., Ltd.) and dyes as described in JP-A No. 62-293247.

The addition of these dyes is preferable because discrimination between an image portion and a non-image portion is intensified after an image is formed. The amount of these dyes to be added is preferably in a range from 0.01 to 10 mass % based on the total solid content of the recording layer.

In the image recording layer of the planographic printing plate precursor of the invention, in order to enhance stability in processes which affect conditions of developing, the following can be added: nonionic surfactants as described in JP-A Nos. 62-251740 and 3-208514; amphoteric surfactants as described in JP-A Nos. 59-121044 and 4-13149; siloxane compounds as described in EP No. 950517; and copolymers made from a fluorine-containing monomer as described in JP-A No. 11-288093.

Specific examples of nonionic surfactants include sorbitan tristearate, sorbitan monopalmitate, sorbitan trioleate, monoglyceride stearate, and polyoxyethylene nonyl phenyl ether. Specific examples of amphoteric surfactants include alkyldi(aminoethyl)glycine, alkylpolyaminoethylglycine hydrochloride, 2-alkyl-N-carboxyethyl-N-hydroxyethylimidazolinium betaine and N-tetradecyl-N,N'-betaine type surfactants (trade name: "Amolgen K", manufactured by Daiichi Kogyo Seiyaku Co., Ltd.).

The siloxane compounds are preferably block copolymers made from dimethylsiloxane and polyalkylene oxide. Specific examples thereof include polyalkylene oxide modified silicones (trade names: DBE-224, DBE-621, DBE-712, DBE-732, and DBE-534, manufactured by Chisso Corporation; trade name: Tego Glide 100, manufactured by Tego Co., Ltd.).

The content of the nonionic surfactant and/or the amphoteric surfactant in the photosensitive composition is preferably from 0.05 to 15% by mass, and more preferably from 0.1 to 5% by mass.

To the photosensitive composition of the invention may be added a printing-out agent for obtaining a visible image immediately after the photosensitive composition of the invention has been heated by exposure to light, or a dye or pigment as an image coloring agent.

A typical example of a printing-out agent is a combination of a compound which is heated by exposure to light, thereby emitting an acid (an optically acid-generating agent), and an organic dye which can form salts (salt formable organic dye).

Specific examples thereof include combinations of an o-naphthoquinonediazide-4-sulfonic acid halogenide with a salt-formable organic dye, described in JP-A Nos. 50-36209 and 53-8128; and combinations of a trihalomethyl compound with a salt-formable organic dye, described in each of JP-A Nos. 53-36223, 54-74728, 60-3626, 61-143748, 61-151644 and 63-58440.

The trihalomethyl compound is classified into an oxazol compound or a triazine compound. Both of the compounds provide excellent in stability over the passage of time and produce a vivid printed-out image.

Examples of other photo-acid releasing agent may include various o-naphthoquinonediazide compounds as described in the publication of JP-A No. 55-62444; 2-trihalomethyl-5-aryl-1,3,4-oxadiazole compound as described in the publication of JP-A No. 55-77742; and diazonium salts.

Whenever necessary, a plasticizer may be added to the image recording layer, i.e., the lower-layer coating solution of the invention to give flexibility to a coating film made from the coating solution. Examples of the plasticizer include oligomers and polymers of butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl olete, and acrylic acid and methacrylic acid.

The planographic printing plate precursor of the invention may be usually produced by applying a lower layer coating solution and a upper recording layer coating solution which are compounded of the aforementioned components one after another to an appropriate support.

Examples of a solvent appropriate for applying the lower layer and image recording layer include, though not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene. These solvents may be used either singly or by mixing them. The concentration of the above components (total solid content including the additives) in the solvent is preferably 1 to 50 mass %.

It is to be noted that the lower layer (lower recording layer) and the upper layer (other recording layer) are preferably formed in such a manner as to separate two layers from each other in principle.

Examples of the method of forming two layers separately include, though not limited to, a method utilizing a difference in solubility in a solvent between the components contained in the lower layer and the components contained in the upper layer and a method in which a solvent is vaporized and removed quickly by drying after the upper layer is applied.

Examples of the method utilizing a difference in solubility in a solvent between the components contained in the lower layer and the components contained in the upper layer include a method using a solvent which does not dissolve the alkali-soluble resin contained in the lower layer when an upper layer coating solution is applied. This makes it possible to separate each layer clearly to form coating films even if two-layer coating is carried out.

For example, components insoluble in solvents such as methyl ethyl ketone and 1-methoxy-2-propanol which dissolve the alkali-soluble resin which is the upper layer component are selected as the lower layer components, the lower layer is applied using a solvent dissolving the lower layer components and dried, then the upper layer components using the alkali-soluble resins primarily are dissolved in methyl ethyl ketone, 1-methoxy-2-propanol or the like and the coating solution is applied and dried whereby the formation of two layers is attained.

When a method is adopted in which a solvent which does not dissolve the alkali-soluble resin contained in the lower layer is used in the case of applying the upper layer coating solution, a solvent which dissolves the alkali-soluble resin contained in the lower layer may be mixed with a solvent which doe not dissolve this alkali-soluble resin. Layer mixing between the upper layer and the lower layer can be arbitrarily controlled by changing the mixing ratio of both solvents.

If the ratio of the solvent that dissolves the alkali-soluble resin contained in the lower layer is increased, a part of the lower layer is dissolved when applying the upper layer and is contained as particle components in the upper layer after the upper layer is dried. The particle component causes projections to be formed on the surface of the upper layer, which betters damage resistance. The dissolution of the lower layer components, on the other hand, tends to deteriorate the film quality of the lower layer and hence resistance to chemicals.

In light of this, it is possible to make various characteristics exhibit themselves (for example, to promote partial compatibility between layers, which will be explained later) by controlling the mixing ratio, taking the characteristics of each solvent into account.

In the case using a mixed solvent as mentioned above as the coating solvent of the upper layer in order to produce the effect of the invention, the amount of the solvent which dissolves the alkali-soluble resin in the lower layer is preferably 80 mass % or less of the amount of the solvent used to apply the upper layer from the viewpoint of resistance to chemicals and more preferably in a range from 10 to 60 mass % taking resistance to damage into account.

Next, as to a method of drying a solvent very quickly after the second layer (upper layer) is applied, high pressure air is sprayed from a slit nozzle located at almost a right angle with respect to the running direction of a web, thermal energy is supplied as conductive heat from the underside of a web through a roll (heating roll) to which a heating medium such as steam is supplied, or a combination of these methods is used, whereby the quick drying of a solvent can be attained.

In the invention, various methods may be used as a method of applying each of the layers such as the image recording layer. Examples of the coating method may include bar coater coating, rotation coating, spray coating, curtain coating, dip coating, air knife coating, blade coating and roll coating.

The coating method used to form the upper layer is preferably carried out in a non-contact system to prevent damages to the lower layer when applying the upper layer. Although bar coater coating, though it is a contact type, may be used as the method generally used in a solvent system coating, it is desirable to carry out coating in forward driving to prevent damages to the lower layer.

The coating amount of the lower recording layer after the layer is dried in the planographic printing plate precursor of the invention is preferably in a range from 0.5 to 1.5 $g/m^2$ and more preferably in a range from 0.7 to 1.0 $g/m^2$ from the viewpoint of ensuring printing durability and suppressing generation of a residual film during developing.

Also, the coating amount of the image recording layer (upper layer) after the layer is dried is preferably in a range from 0.05 to 1.0 $g/m^2$ and more preferably in a range from 0.07 to 0.7 $g/m^2$. In the case where the upper layer is constituted of two or more layers, the above amount indicates the total amount of these two or more layers.

In each of these recording layers, apparent sensitivity is increased as the coating amount is decreased; however, developing latitude and coating film characteristics tend to deteriorate. Particularly in the case where the film thickness of the recording layer is too thick, the recording layer is easily influenced by heat diffusion in the deep part thereof and there is therefore a fear as to a reduction in image forming characteristics in the vicinity of the support.

A surfactant, for example, a fluorine type surfactant as described in the publication of JP-A No. 62-170950 may be added in the coating solutions for the lower layer or other recording layers to better coating characteristics. The amount of the surfactant is preferably 0.01 to 1 mass % and more preferably 0.05 to 0.5 mass % based on the total solid content of the coating solution.

[Support]

The support used in the planographic printing plate precursor is a plate having dimensional stability. A plate satisfying required physical properties such as strength and flexibility can be used without any restriction. Examples thereof include paper, plastic (such as polyethylene, polypropylene or polystyrene)-laminated papers, metal plates (such as aluminum, zinc and copper plates), plastic films (such as cellulose biacetate, cellulose triacetate, cellulose propionate, cellulose lactate, cellulose acetate lactate, cellulose nitrate, polyethylene terephthalate, polyethylene, polystyrene, polypropylene, polycarbonate, and polyvinyl acetate films), and papers or plastic films on which, as described above, a metal is laminated or vapor-deposited.

The support is preferably a polyester film or an aluminum plate, and more preferably an aluminum plate, since an aluminum plate is superior in terms of dimensional stability and is also relatively inexpensive.

Preferable examples of the aluminum plate include a pure aluminum plate and alloy plates made of aluminum as a main component with a very small amount of other elements. A plastic film on which aluminum is laminated or vapor-deposited may also be used.

Examples of other elements contained in the aluminum alloys include silicon, iron, manganese, copper, magnesium, chromium, zinc, bismuth, nickel, and titanium. The content by percentage of different elements in the alloy is at most 10% by mass. A particularly preferable aluminum plate in the invention is a pure aluminum plate; however, since from the viewpoint of refining a completely pure aluminum cannot be easily produced, a very small amount of other elements may also be contained in the plate.

The aluminum plate used as the support is not specified in terms of the composition thereof. Thus, aluminum plates which are conventionally known can be appropriately used. The thickness of the aluminum plate used in the invention is from about 0.1 to 0.6 mm, preferably from 0.15 to 0.4 mm, and more preferably from 0.2 to 0.3 mm.

If necessary, prior to the surface-roughening treatment, the aluminum plate may optionally be subjected to degreasing treatment, in order to remove rolling oil or the like on the surface, with a surfactant, an organic solvent, an aqueous alkaline solution or the like.

The surface-roughening treatment of the aluminum surface can be performed by various methods such as a mechanical surface-roughening method, a method of dissolving and roughening the surface electrochemically, and a method of dissolving the surface selectively in a chemical manner.

Mechanical surface-roughening methods which can be used may be known methods, such as a ball polishing method, a brush polishing method, a blast polishing method or a buff polishing method. An electrochemical surface-roughening method may be a method of performing surface-roughening in an electrolyte of hydrochloric acid or nitric acid, by use of an alternating current or a direct current. As disclosed in JP-A No. 54-63902, a combination of the two kinds of methods may be used.

An aluminum plate whose surface is roughened as described above is if necessary subjected to alkali-etching treatment and neutralizing treatment. Thereafter, an anodizing treatment is optionally applied in order to improve the water holding capacity and wear resistance of the surface.

The electrolyte used in the anodizing treatment of the aluminum plate is any one selected from various electrolytes which can form a porous oxide film. Among which in general use are electrolytes of sulfuric acid, phosphoric acid, oxalic acid, chromic acid, or a mixed acid thereof. The concentration of the electrolyte may be appropriately decided depending on the kind of electrolyte selected.

Treatment conditions for anodization cannot be specified as a general rule since conditions vary depending on the electrolyte used; however, the following range of conditions are generally suitable: an electrolyte concentration of 1 to 80% by mass, a solution temperature of 5 to 70° C., a current density of 5 to 60 $A/dm^2$, a voltage of 1 to 100 V, and an electrolyzing time of 10 seconds to 5 minutes. If the amount of anodic oxide film is less than 1.0 $g/m^2$, printing resistance is inadequate or non-image portions of the planographic printing plate tend to become easily damaged and the so-called “blemish stains”, resulting from ink adhering to damaged portions at the time of printing, are easily generated.

After the anodizing treatment, the surface of the aluminum is if necessary subjected to treatment for obtaining hydrophilicity. This securance of hydrophilicity treatment may be an alkali metal silicate (for example, an aqueous sodium silicate solution) method, as disclosed in U.S. Pat. Nos. 2,714,066, 3,181,461, 3,280,734, and 3,902,734. In this method, the support is subjected to an immersing treatment or an electrolyzing treatment with an aqueous sodium silicate solution.

In addition, the following methods may also be used: a method of treating the support with potassium fluorozirconate, as disclosed in JP-B No. 36-22063, or with polyvinyl phosphonic acid, as disclosed in U.S. Pat. Nos. 3,276,868, 4,153,461, and 4,689,272.

The planographic printing plate precursor of the invention comprises at least two layers including the aforementioned lower recording layer and upper recording layer which are laminated on the support. The planographic printing plate precursor may be provided with an undercoat layer between the support and the lower layer according to the need.

As components of the undercoat layer, various organic compounds can be used. Examples thereof include carboxymethylcellulose, dextrin, gum arabic, phosphonic acids having an amino group, such as 2-aminoethylphosphonic acid, organic phosphonic acids which may have a substituent, such as phenyl phosphonic acid, naphthylphosphonic acid, alkylphosphonic acid, glycerophosphonic acid, methylenediphosphonic acid and ethylenediphosphonic acid, organic phosphoric acids which may have a substituent, such as phenylphosphoric acid, naphthylphosphoric acid, alkylphosphoric acid and glycerophosphoric acid, organic phosphinic acids which may have a substituent, such as phenylphosphinic acid, naphthylphosphinic acid, alkylphosphinic acid and glycerophosphinic acid, amino acids such as glycine and β-alanine, and hydrochlorides of amines having a hydroxyl group, such as a hydrochloride of triethanolamine. These organic compounds may be used alone or in the form of a mixture made up of two or more thereof.

This organic undercoat layer may be formed by methods which can be described as follows: a method of applying onto the aluminum plate a solution wherein the above-mentioned organic compound is dissolved in water, or an organic solvent such as methanol, ethanol or methyl ethyl ketone, or a mixed solvent thereof and then drying the resultant aluminum plate, or a method of immersing the aluminum plate into a solution wherein the above-mentioned organic compound is dissolved in water, or an organic solvent such as methanol, ethanol or methyl ethyl ketone, or a mixed solvent thereof so as to adsorb the compound, washing the aluminum plate with water or the like, and then drying the resultant aluminum plate.

In the former method, the solution of the organic compound having a concentration of 0.05 to 10% by mass may be applied in various ways. In the latter method, the concentration of the organic compound in the solution is from 0.01 to 20%, preferably from 0.05 to 5%, the temperature for the immersion is from 20 to 90° C., preferably from 25 to 50° C., and the time taken for immersion is from 0.1 second to 20 minutes, preferably from 2 seconds to 1 minute.

The pH of the solution used in the above-mentioned methods can be adjusted into a range of 1 to 12 with a basic material such as ammonia, triethylamine or potassium hydroxide, or an acidic material such as hydrochloric acid or phosphoric acid. Moreover, a yellow dye may be added to the solution, in order to improve the tone reproducibility of the recording layer.

The amount of organic undercoat layer applied is suitably from 2 to 200 mg/m$^2$, preferably from 5 to 100 mg/m$^2$. When the above coating amount is less than 2 mg/m$^2$, sufficient printing durability is not obtained. Also, when the amount is larger than 200 mg/m$^2$, the same result is obtained.

The positive planographic printing plate precursor produced in the above manner is usually subjected to image exposure and developing treatment.

Examples of the light source of the active rays used for image exposure include a mercury lamp, metal halide lamp, xenon lamp, chemical lamp and carbon arc lamp. Examples of the radial rays, electron rays, X-rays, ion beams and far infrared radiation. Also, g-rays, i-rays, Deep-UV light and high-density energy beams (laser beams) may also be used.

Examples of the laser beam include helium·neon laser, argon laser, krypton laser, helium·cadmium laser and KrF excimer laser.

In the invention, the planographic printing plate precursor is preferably exposed to light from, particularly, a light source having an emitting wavelength in the near-infrared region to the infrared region; specifically, the planographic printing plate precursor is preferably exposed image-wise to light from a solid laser or semiconductor laser radiating infrared rays having a wavelength of 760 nm to 1200 nm.

The planographic printing plate precursor of the invention is developed using water or an alkali developing solution after exposure. Although the developing treatment may be carried out immediately after exposure, heating treatment may be carried out between an exposure step and a developing step. When the heat treatment is carried out, the heating is preferably carried out at a temperature range from 60° C. to 150° C. for 5 seconds to 5 minutes. As the heating method, conventionally known various methods may be used. Examples of the heating method include a method in which a recording material is heated with bringing it into contact with a panel heater or ceramic heater and a non-contact method using a lamp or hot air. This heat treatment makes it possible to reduce the energy required for recording when a laser is applied.

As a developing solution and replenishing solution to be used for plate-making of the planographic printing plate of the invention, a conventionally known aqueous alkali solution may be used.

The developing solution which may be applied to the developing treatment of the planographic printing plate precursor of the invention is a developing solution having a pH range from 9.0 to 14.0 and preferably a pH range from 12.0 to 13.5. As the developing solution (hereinafter referred to as a developing solution including a replenishing solution), a conventionally known aqueous alkali solution may be used.

Examples of the alkali agent include inorganic alkali salts such as sodium silicate, potassium silicate, trisodium phosphate, tripotassium phosphate, triammonium phosphate, disodium hydrogenphosphate, dipotassium hydrogenphosphate, diammonium hydrogenphosphate, sodium carbonate, potassium carbonate, ammonium carbonate, sodium hydrogencarbonate, potassium hydrogencarbonate, ammonium hydrogen carbonate, sodium borate, potassium borate, ammonium borate, sodium hydroxide, ammonium hydroxide, potassium hydroxide and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents may be used alone or in combinations of two or more thereof.

Moreover, an aqueous alkali solution comprising a non-reducing sugar and a base may also be used. The non-reducing sugar represents sugars having no reducing ability because they have neither a free aldehyde group nor a ketone group and are classified into trehalose type oligosaccharides in which reducing groups are combined with other, glycosides in which reducing groups of sugars are combined with non-sugars and sugar alcohols in which sugars are reduced by hydrogenation. Any of these non-reducing sugars may be preferably used.

Examples of the trehalose type oligosaccharides include saccharose and trehalose. Examples of the glucosides include alkylglucosides, phenolglucosides, and mustard seed oil glucoside. Examples of the sugar alcohols include D, L-arabite, ribitol, xylitol, D, L-sorbitos, D, L-mannitol, D, L-iditol, D, L-talitol, dulcitol, and allodulcitol. Furthermore, maltitol, obtained by hydrogenating a disaccharide, and a reductant obtained by hydrogenating an oligosaccharide (i.e., reduced starch syrup) are preferable. Of these examples, sugar alcohol and saccharose are more preferable. D-sorbitol, saccharose, and reduced starch syrup are even more preferable since they have buffer effect within an appropriate pH range and are inexpensive.

These nonreducing sugars may be used alone or in combination of two or more thereof. The percentage thereof in the developer is preferably from 0.1 to 30% by mass, more preferably from 1 to 20% by mass from the viewpoints of the buffer effect and the developing power of the solution.

The base combined with the nonreducing sugar(s) may be an alkali agent that has been known so far. Examples thereof include inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

The bases may be used alone or in combination of two or more. Among the bases, sodium hydroxide and potassium hydroxide are preferable. The reason is that pH adjustment can be made in a wide pH range by regulating the amount of the alkali agent to be added to the non-reducing sugar. Also, trisodium phosphate, sodium carbonate, potassium carbonate or the like itself have a buffer action and are hence preferable.

In a case where an automatic developing machine is used to perform development, an aqueous solution having a higher alkali intensity than that of the developer (or, replenisher) can be added to the developer. It is known that this makes it possible to treat a great number of photosensitive plates without recourse to replacing the developer in the developing tank over a long period of time. This replenishing manner is also preferably used in the invention.

If necessary, various surfactants or organic solvents can be incorporated into the developer and the replenisher in order to promote and suppress development capacity, disperse development scum, and enhance the ink-affinity of image portions of the printing plate.

Preferable examples of the surfactant include anionic, cationic, nonionic and amphoteric surfactants. If necessary, the following may be added to the developer and the replenisher: a reducing agent (such as hydroquinone, resorcin, a sodium or potassium salt of an inorganic acid such as sulfurous acid or hydrogen sulfite acid), an organic carboxylic acid, an antifoaming agent, and a water softener.

The printing plate developed with the developer and replenisher described above is subsequently subjected to treatments with washing water, a rinse solution containing a surfactant and other components, and a desensitizing solution containing gum arabic and a starch derivative. For after treatment following use of the photosensitive composition of the invention as a planographic printing plate precursor, various combinations of these treatments may be employed.

In recent years, automatic developing machines for printing plate precursors have been widely used in order to rationalize and standardize plate-making processes in the plate-making and printing industries. These automatic developing machines are generally made up of a developing section and a post-processing section, and include a device for carrying printing plate precursors, various treating solution tanks, and spray devices. These machines are machines for spraying respective treating solutions, which are pumped up, onto an exposed printing plate through spray nozzles, for development, while the printing plate is transported horizontally.

Recently, a method has also attracted attention in which a printing plate precursor is immersed in treating solution tanks filled with treating solutions and conveyed by means of in-liquid guide rolls. Such automatic processing can be performed while replenishers are being replenished into the respective treating solutions in accordance with the amounts to be treated, operating times, and other factors.

A so-called use-and-dispose processing manner can also be used, in which treatments are conducted with treating solutions which in practice have yet been used.

A method of treating the heat-sensitive planographic printing plate precursor of the invention will be explained. In cases where unnecessary image portions (for example, a film edge mark of an original picture film) are present on a planographic printing plate obtained by exposing imagewise to light a planographic printing plate precursor to which the invention is applied, developing the exposed precursor, and subjecting the developed precursor to water-washing and/or rinsing and/or desensitizing treatment(s), unnecessary image portions can be erased.

The erasing is preferably performed by applying an erasing solution to unnecessary image portions, leaving the printing plate as it is for a given time, and washing the plate with water, as described in, for example, JP-B No. 2-13293. This erasing may also be performed by a method of radiating active rays introduced through an optical fiber onto the unnecessary image portions, and then developing the plate, as described in JP-A No. 59-174842.

The planographic printing plate obtained as described above is, if desired, coated with a desensitizing gum, and subsequently the plate can be made available for a printing step. When it is desired to make a planographic printing plate have a higher degree of printing resistance, baking treatment is applied to the planographic printing plate.

In a case where the planographic printing plate is subjected to the baking treatment, it is preferable that before the baking treatment takes place the plate is treated with a surface-adjusting solution as described in JP-B No. 61-2518, or JP-A Nos. 55-28062, 62-31859 or 61-159655.

This method of treatment is, for example, a method of applying the surface-adjusting solution onto the planographic printing plate with a sponge or absorbent cotton infiltrated with the solution, a method of immersing the planographic printing plate in a vat filled with the surface-adjusting solution, or a method of applying the surface-adjusting solution to the planographic printing plate with an automatic coater. In a case where after application the amount of solution applied is made uniform with a squeegee or a squeegee roller, a better result can be obtained.

In general, the amount of surface-adjusting solution applied is suitably from 0.03 to 0.8 $g/m^2$ (dry mass). If necessary the planographic printing plate onto which the surface-adjusting solution is applied can be dried, and then the plate is heated to a high temperature by means of a baking processor (for example, a baking processor (BP-1300) sold by Fuji Photo Film Co., Ltd.) or the like. In this case the heating temperature and the heating time, which depend on the kind of components forming the image, are preferably from 180 to 300° C. and from 1 to 20 minutes, respectively.

If necessary, a planographic printing plate subjected to baking treatment can be subjected to treatments which have been conventionally conducted, such as a water-washing treatment and gum coating. However, in a case where a surface-adjusting solution containing a water soluble polymer compound or the like is used, the so-called desensitizing treatment (for example, gum coating) can be omitted. The planographic printing plate obtained as a result of such treatments is applied to an offset printing machine or to some other printing machine, and is used for printing on a great number of sheets.

EXAMPLES

The invention will be explained by way of examples, which, however, do not limit the scope of the invention.

Examples 1 to 3

(Production of a Substrate)

An aluminum alloy having the following composition was used to prepare a molten bath: Si: 0.06 mass %, Fe: 0.30 mass %, Cu: 0.014 mass %, Mn: 0.001 mass %, Mg: 0.001 mass %, Zn: 0.001 mass % and Ti: 0.03 mass %, wherein the balance was Al and unavoidable impurities. The molten bath was subjected to molten bath treatment and filtered to produce an ingot having a thickness of 500 mm and a width of 1200 mm by a Direct Chill (DC) casting method. The surface of the ingot was scalped using a scalping machine to an average thickness of 10 mm. The ingot was then kept at 550° C. by heating it uniformly for about 5 hours and then, when the temperature was lowered to 400° C., the ingot was made into a rolled plate 2.7 mm in thickness by using a hot rolling mill. The rolled plate was further heat-treated at 500° C. by using a continuous annealing machine and then, cold-rolled to produce a finished 0.24-mm-thick aluminum plate. This aluminum plate was cut into a width of 1030 mm and then subjected to the surface treatment shown below.

<Surface Treatment>

The surface treatment was performed by carrying out the following various treatments (a) to (j) continuously. Each treatment and washing was followed by draining off water using a nip roller.

(a) Mechanical Surface Roughening Treatment

While a suspension containing a polishing agent (silica sand) with a specific gravity of 1.12 and water was supplied as a polishing slurry to a surface of each aluminum sheet, and mechanical surface roughening was carried out by rotating roller type nylon brushes. The average particle size of the polishing agent was 8 μm and maximum particle size 50 μm. The material of the nylon brushes was 6-10 nylon and hair length and hair diameters were 50 mm and 0.3 mm, respectively. The nylon brushes were produced by implanting the hairs densely in holes formed in stainless cylinders with a diameter of 300 mm. Three rotating brushes were used. Two supporting rollers (200 mm diameter) were placed below the brushes with a separation of 300 mm. The brush rollers were pushed until the load of the driving motor for rotating the brushes was increased by 7 kW or more from the load before pushing the brush rollers against the aluminum sheet. The rotation direction of the brushes was the same as the moving direction of the aluminum sheet. The rotation speed of the brushes was 200 rpm.

(b) Alkaline Etching Treatment

Etching treatment was carried out by spraying an aqueous NaOH solution (concentration 26% by weight and an aluminum ion concentration 6.5% by weight) at 70° C. to the obtained aluminum sheet in order to dissolve an amount of 6 $g/m^2$ aluminum sheet. After that, the aluminum sheet was washed with water by spraying.

(c) Desmut Treatment

Desmut treatment was carried out by spraying an aqueous solution of 1% by weight nitric acid (containing an aluminum ion concentration of 0.5% by weight) at 30° C. and then the resulting aluminum sheet was washed with water. As the aqueous nitric acid solution used for desmut, waste solution from a process of electrochemical surface roughening in an aqueous nitric acid solution by AC (alternate current) can be used.

(d) Electrochemical Surface Roughening Treatment

Electrochemical surface roughening treatment can be carried out continuously by using 60 Hz AC voltage. The electrolytic solution used in this case was an aqueous solution of nitric acid 10.5 g/L (aluminum ion 5 g/L) at 50° C. The electrochemical surface roughening can be carried out using an AC power waveform which is a trapezoidal rectangular waveform, with the time TP from a zero current value to a peak being 0.8 msec and Duty ratio 1:1, and employing a carbon electrode as an opposed electrode. Ferrite was used as an auxiliary anode. A radial cell type electrolytic bath was used.

The current density was 30 $A/dm^2$ at the peak value of the current and the total electricity quantity was 220 $C/dm^2$ when aluminum sheet was used as an anode. Five percent of the electric current flowing from the electric power was shunted through the auxiliary anode.

After that, the resulting aluminum sheet was washed with a water spray.

(e) Alkali Etching Treatment

Etching treatment can be carried out on the aluminum sheet at 32° C. by spraying a solution with sodium hydroxide concentration 26% by weight and aluminum ion concentration 6.5% by weight. By doing this 0.2 g/m$^2$ of the aluminum sheet was dissolved so as to remove the smut component of mainly aluminum hydroxide produced when carrying out the electrochemical surface roughening by using alternating current in the prior step. It also has the effect of dissolving the edge parts of formed pits so as to smooth the edge parts. After that, the aluminum sheet was washed by water spray.

(f) Desmut Treatment

Desmut treatment was carried out by spraying an aqueous solution of 15% by weight nitric acid (containing aluminum ion 4.5% by weight) at 30° C. and then the resulting aluminum sheet was washed by water spray. For the aqueous nitric acid solution used for the desmut, waste solution from the process of electrochemical surface roughening in an aqueous nitric acid solution by AC can be used.

(g) Anodic Oxidation Treatment

An anodic oxidizing device using a two-stage-power-supply electrolytic treating method (each length of the first and second electrolytic sections: 6 m, each length of the first and second power-supply sections: 3 m and each length of the first and second power-supply electrodes: 2.4 m) was used to carry out anodic oxidation treatment. As the electrolytic solution supplied to the first and second electrolytic sections, sulfuric acid was used. All the electrolytic solutions contained 170 g/L of sulfuric acid (including 0.5 mass % of aluminum ions) and were used at 43° C. Then, the support was washed with water by spraying. The amount of the final oxide film was 2.7 g/m$^2$.

(h) Alkali Metal Silicate Treatment

The aluminum support obtained by anodic oxidation treatment was dipped in a treating vessel filled with an aqueous 1 mass % No. 3 sodium silicate solution at 30° C. for 10 seconds to carry out alkali metal silicate treatment (silicate treatment). Then, the support was washed with water by spraying.

(i) Formation of an Undercoat Layer

The aluminum support treated with an alkali metal silicate in the above manner was coated with an undercoat solution having the following composition and was dried at 80° C. for 15 seconds to form a coating layer. The coating amount after drying was 15 mg/m$^2$.

<Composition of the undercoat solution>

| | |
|---|---|
| Compound shown below | 0.3 g |
| Methanol | 100 g |
| Water | 1 g |

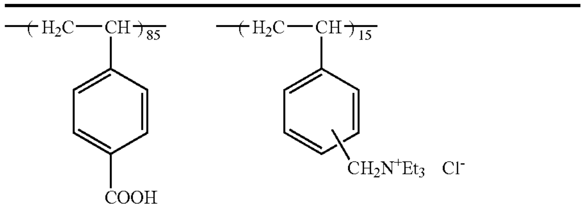

Molecular weight: 28,000

In examples 1 to 3, the support thus obtained was coated with the following undercoat layer coating solution in a coating amount of 0.85 g/m$^2$ and then dried at 140° C. for 50 seconds in PERFECT OVEN PH200 manufactured by TABAI Co., Ltd. with setting Wind Control to 7. Then, an upper image recording layer coating solution was applied in an amount of 0.15 g/m$^2$ and then dried at 120° C. for one minute to obtain planographic printing plate precursors 1 to 3.

<Lower recording layer coating solution>

| | |
|---|---|
| N-(4-aminosulfonylphenyl) methacrylamide/acrylonitrile/ methylmethacrylate (36/34/30, weight average molecular weight: 100000, acid value: 2.65) | (Amount described in Table 1, A g) |
| m,p-Cresol novolac (m/p ratio = 6/4, weight average molecular weight: 4500, containing unreacted cresol: 0.8 mass %) | (Amount described in Table 1, B g) |
| Cyanine dye A (following structure: mixed type) | 0.109 g |
| 4,4'-bishydroxyphenylsulfone | (Amount described in Table 1, C g) |
| Tetrahydrophthalic acid anhydride | 0.190 g |
| p-Toluenesulfonic acid | 0.008 g |
| 3-Methoxy-4-diazodiphenylamine hexafluorophosphate | 0.030 g |
| Compound obtained by changing the counter ion of Ethyl Violet to 6-hydroxynaphthalenesulfone | 0.10 g |
| Fluorine type surfactant (surface condition improving surfactant) (Megafack F-781F, manufactured by Dainippon Ink and Chemicals, Incorporated) | 0.035 g |
| Methyl ethyl ketone | 24.38 g |
| 1-Methoxy-2-Propanol | 13.0 g |
| γ-butyrolactone | 14.2 g |

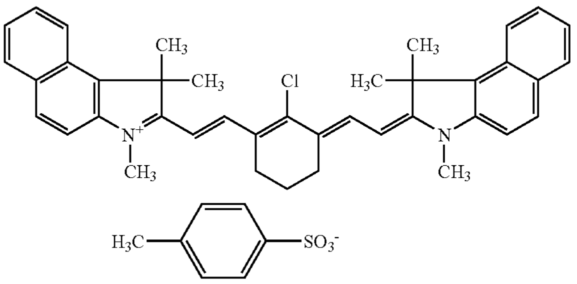

Cyanine dye A

TABLE 1

| | Example 1 | Example 2 | Example 3 |
|---|---|---|---|
| A (g) | 1.92 | 1.70 | 1.82 |
| B (g) | 0.192 | 0.43 | 0.32 |
| C (g) | 0.123 | 0.130 | 0.135 |

<Upper recording layer coating solution>

| | |
|---|---|
| m,p-Cresol novolac (m/p ratio = 6/4, weight average molecular weight: 4500, containing unreacted cresol: 0.8 mass %) | 0.2846 g |
| Cyanine dye A | 0.075 g |
| Behenic acid amide | 0.060 g |
| Fluorine type surfactant (surface condition improving surfactant) (Megafack F-781F, manufactured by Dainippon Ink and Chemicals, Incorporated) | 0.022 g |

-continued

| <Upper recording layer coating solution> | |
|---|---|
| Image forming improvement fluorine type surfactant (Megafack F-780 (30%), manufactured by Dainippon Ink and Chemicals, Incorporated) | 0.022 g |
| Methyl ethyl ketone | 15.1 g |
| 1-Methoxy-2-Propanol | 7.7 g |

Examples 4 to 6

Planographic printing plate precursors 4 to 6 were obtained in the same manner as in Example 1, except that the lower recording layer coating solution was altered.

| <Lower recording layer coating solution> | |
|---|---|
| N-(4-aminosulfonylphenyl)methacrylamide/acrylonitrile/methylmethacrylate (36/34/30, weight average molecular weight: 100000, acid value: 2.65) | (Amount described in Table 2, D g) |
| PD-1 (following structure) | (Amount described in Table 2, E g) |
| Dye C (following structure) | 0.109 g |
| 4,4'-Bishydroxyphenylsulfone | 0.126 g |
| Tetrahydrophthalic acid anhydride | 0.190 g |
| p-Toluenesulfonic acid | (Amount described in Table 2, F g) |
| 3-Methoxy-4-diazodiphenylamine hexafluorophosphate | 0.030 g |
| Compound obtained by changing the counter ion of Ethyl Violet to 6-hydroxynaphthalenesulfone | 0.10 g |
| Methyl ethyl ketone | 25.36 g |
| 1-Methoxy-2-Propanol | 13.0 g |
| γ-butyrolactone | 13.2 g |

TABLE 2

| | Example 4 | Example 5 | Example 6 |
|---|---|---|---|
| C (g) | 1.920 | 1.70 | 1.82 |
| D (g) | 0.192 | 0.43 | 0.32 |
| E (g) | 0.120 | 0.123 | 0.130 |

Dye C

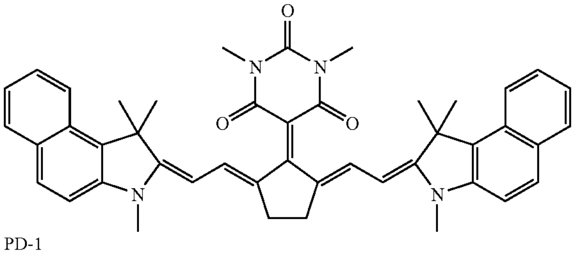

PD-1

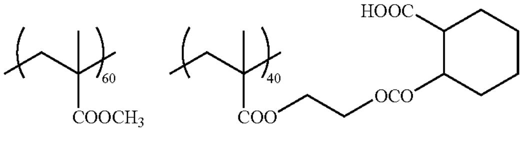

Example 7

A planographic printing plate precursor 7 was obtained in the same manner as in Example 1 except that the upper recording layer was applied such that the coating amount of the recording layer was 0.20 g/$m^2$.

Example 8

A planographic printing plate precursor 8 was obtained in the same manner as in Example 1 except that: the above (h) Alkali metal silicate treatment was not carried out; and, an undercoat solution having the following composition was applied in step (i) and dried at 80° C. for 30 minutes such that the coating amount after the composition was dried was 10 mg/$m^2$ in the production of the substrate in Example 1.

| (Undercoat solution) | |
|---|---|
| β-alanine | 0.1 g |
| Phenylsulfonic acid | 0.05 g |
| Methanol | 40 g |
| Pure water | 60 g |

Example 9

(Production of a Substrate)

An aluminum alloy having the following composition was used to prepare a molten bath: Si: 0.06 mass %, Fe: 0.30 mass %, Cu: 0.025 mass %, Mn: 0.001 mass %, Mg: 0.001 mass %, Zn: 0.001 mass % and Ti: 0.03 mass %, wherein tThe balance was Al with unavoidable impurities. The molten bath was subjected to molten bath treatment and filtered to produce an ingot having a thickness of 500 mm and a width of 1200 mm by a DC casting method.

The surface of the ingot was scalped using a scalping machine to an average thickness of 10 mm. The ingot was then kept at 550° C. by heating it uniformly for about 5 hours and then, when the temperature was lowered to 400° C., the ingot was made into a rolled plate 2.7 mm thick using a hot rolling mill. The rolled plate was further heat-treated at 500° C. using a continuous annealing machine and then, cold-rolled to produce a finished 0.30-mm-thick aluminum plate.

This aluminum plate was cut into a width of 1030 mm and then processed continuously by the surface treatment shown below.

(a) Mechanical Surface Roughing Treatment (Brush Grain Method)

Mechanical surface roughing treatment was carried out by a rotating roller-like nylon brush with supplying an aqueous suspension (specific gravity: 1.1 g/$cm^3$) of an abrasive agent (pumice) as an abrasive slurry solution to the surface of the aluminum plate. The median diameter of the abrasive agent was 33 μm. The roller-like brush was obtained by opening holes in a stainless cylinder having a diameter of 400 mm and by planting nylon bristles therein densely. The material of the nylon brush was 6,10 nylon wherein the bristle length was 50 mm and the diameter of the bristle was 0.3 mm. The distance between two support rollers (diameter: 250 mm) under the brush was 300 mm. The brush roller was pressed to the aluminum plate until the load was increased to a load higher by 10 kW than that before it was pressed to the aluminum plate.

(b) Etching Treatment Using an Alkali Agent

The aluminum plate, obtained above after the mechanical surface roughing treatment, was subjected to etching treatment performed by spraying an aqueous solution containing 2.6 mass % of caustic soda and 5 mass % of aluminum ions to etch 10 $g/m^2$ of the aluminum plate, followed by washing with water by spraying. The temperature of the alkali etching treatment was 70° C.

(c) Desmutting Treatment

Desmutting treatment was carried out using an aqueous 1 mass % nitric acid solution (containing 0.5 mass % of aluminum ions) kept at 30° C., followed by washing with water by spraying.

(d) Electrochemical Surface Roughing Treatment

Electrochemical surface roughing treatment was continuously carried out using an AC voltage at 60 Hz. The electrolytic solution used at this time was an aqueous 10 mass % nitric acid solution (including 0.5 mass % of aluminum ions) and the temperature of this electrolytic solution was 35° C.

The current density was 30 $A/dm^2$ as a peak current, and 5% of the current flowing from the power source was supplied separately to an auxiliary electrode. The quantity of electricity was 197 $C/dm^2$ as the total quantity of electricity during nitric acid electrolysis when the aluminum plate was the anode.

Thereafter, the aluminum plate was washed by water spraying.

(e) Alkali Etching Treatment

The aluminum plate was subjected to etching treatment carried out at 70° C. by spraying an aqueous solution containing 26 mass % of caustic soda and 6.5 mass % of aluminum ions to etch the aluminum plate in an amount of 3.8 $g/m^2$. Then, the aluminum plate was washed with water by spraying.

(f) Desmutting Treatment

An aqueous 1 mass % nitric acid solution (including 0.5 mass % of aluminum ions) was used to carry out desmutting treatment at 30° C. by spraying, followed by washing by water spray.

(g) Anodic Oxidation Treatment

Electrochemical surface roughing treatment was continuously carried out using an AC voltage at 60 Hz. The temperature of this electrolytic solution was 40° C. The AC power source had the waveform shown in FIG. 1. Using a trapezoidal rectangular wave AC current wherein the time TP required for current value to reach a peak from 0 was 0.8 msec and the duty ratio was 1:1, electrochemical surface roughing treatment was carried out using a carbon electrode as a counter electrode. As the auxiliary anode, ferrite was used.

The current density was 25 $A/dm^2$ as a peak current.

Figure 2:
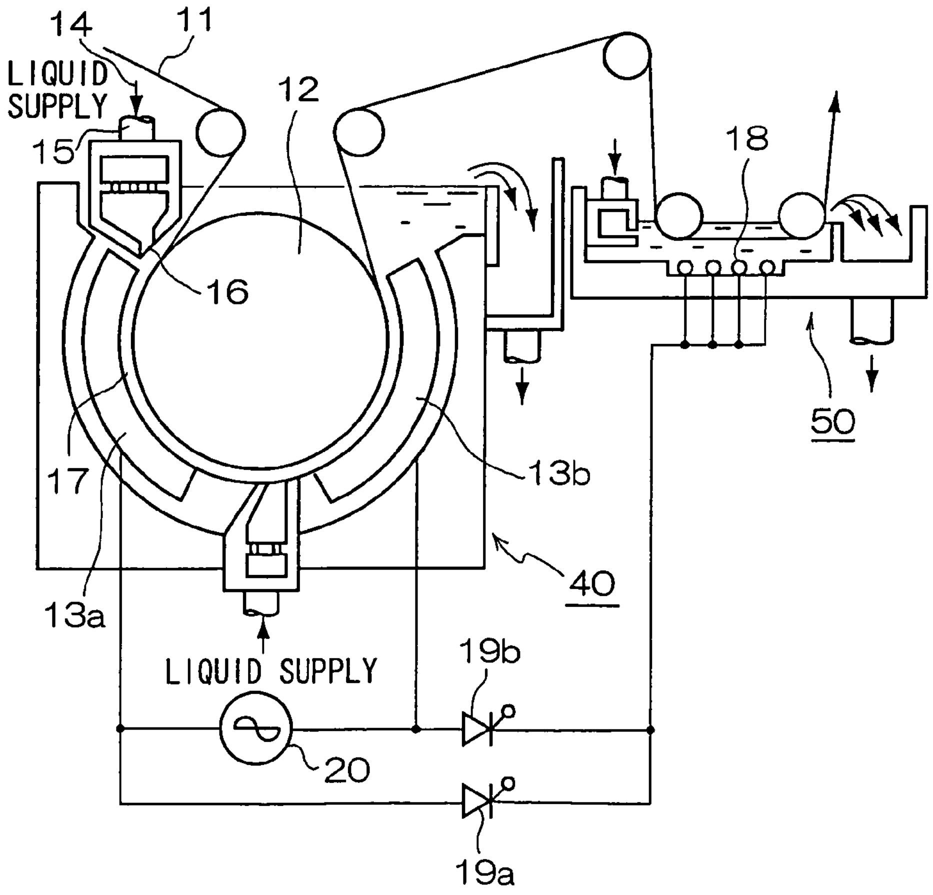
FIG. 2 is a side view showing one example of a radial type cell for electrochemical surface roughing treatment using alternate current in the production of a support of a planographic printing plate precursor according to the invention.

The electrolytic solution used for hydrochloric acid electrolysis was an aqueous 5.0 mass % hydrochloric acid solution (including 5.0 mass % of aluminum ions), and the quantity of electricity in hydrochloric acid electrolysis was 60 $C/dm^2$ as the total quantity of electricity when the aluminum plate was an anode. As the electrolytic vessel, a vessel shown in FIG. 2 was used. Then the aluminum plate was washed by water spray.

(h) Alkali Etching Treatment

The aluminum plate was subjected to etching treatment carried out spraying an aqueous solution containing 4.5 mass % of caustic soda and 0.5 mass % of aluminum ions to etch the aluminum plate in an amount of 0.16 $g/m^2$. Then, the aluminum plate was washed by water spray. The temperature of the alkali etching treatment was 70° C. Then, the aluminum plate was washed by water spray.

(i) Desmutting Treatment

An aqueous 25 mass % sulfuric acid solution (including 0.5 mass % of aluminum ions) was used to carry out desmutting treatment at 60° C. by spraying, followed by washing by water spray.

(j) Anodic Oxidation Treatment

An anodic oxidizing device using two-stage-power-supply electrolytic treating method (each length of the first and second electrolytic sections: 6 m, each length of the first and second power-supply sections: 3 m and each length of the first and second power-supply electrodes: 2.4 m) was used to carry out anodic oxidation treatment.

As the electrolytic solution supplied to the first and second electrolytic sections, sulfuric acid was used. All the electrolytic solutions had a sulfuric acid concentration of 15 mass % (including 0.5 mass % of aluminum ions) and the temperature was 38° C. Then, the support was washed with water by spraying. The amount of the final oxide film was 2.5 $g/m^2$.

(k) Formation of an Undercoat Layer

Next, the aluminum support which had been treated by alkali metal silicate treatment in the above manner was coated with the same undercoat solution that was used in Example 1 and dried at 80° C. for 15 seconds to form a coating layer. The coating amount after drying was 15 $mg/m^2$.

A planographic printing plate precursor 9 was obtained in the same manner as in Example 1 except that the above substrate was used.

Comparative Example 1

A planographic printing plate precursor 10 was obtained in the same manner as in Example 1 except that the lower layer coating solution of Example 1 was altered to the following coating solution.

| <Undercoat solution> | |
|---|---|
| N-(4-aminosulfonylphenyl)methacrylamide/acrylonitrile/methylmethacrylate (36/34/30, weight average molecular weight: 100000, acid value: 2 | 2.133 g |
| Cyanine dye A (the aforementioned structure) | 0.109 g |
| 4,4'-bishydroxyphenylsulfone | 0.126 g |
| Tetrahydrophthalic acid anhydride | 0.190 g |
| p-Toluenesulfonic acid | 0.008 g |
| 3-Methoxy-4-diazodiphenylamine hexafluorophosphate | 0.030 g |
| Compound obtained by changing the counter ion of Ethyl Violet to 6-hydroxynaphthalenesulfone | 0.10 g |
| Fluorine type surfactant (surface condition improving surfactant) (Megafack F176 (20%), manufactured by Dainippon Ink and Chemicals, Incorporated) | 0.035 g |
| Methyl ethyl ketone | 25.38 g |
| 1-Methoxy-2-Propanol | 13.0 g |
| γ-butyrolactone | 13.2 g |

Comparative Example 2

A planographic printing plate precursor 11 was obtained in the same manner as in Example 1 except that the following lower layer coating solution of Example 1 was altered to the following coating solution.

| <Lower layer coating solution> | |
|---|---|
| PD-1 (the above compound) | 2.133 g |
| Cyanine Dye A (the above structure) | 0.109 g |
| 4,4'-Bishydroxyphenylsulfone | 0.126 g |
| Tetrahydrophthalic acid anhydride | 0.190 g |
| p-Toluenesulfonic acid | 0.008 g |
| 3-Methoxy-4-diazodiphenylamine hexafluorophosphate | 0.030 g |
| Compound obtained by changing the counter ion of Ethyl Violet to 6-hydroxynaphthalenesulfone | 0.10 g |
| Fluorine type surfactant (surface condition improving surfactant) (Megafack F-176 (20%), manufactured by Dainippon Ink and Chemicals, Incorporated) | 0.035 g |
| Methyl ethyl ketone | 25.38 g |
| 1-Methoxy-2-Propanol | 13.0 g |
| γ-butyrolactone | 13.2 g |

(Confirmation of Dispersion Phase)

A section of the recording layer, obtained by cutting each planographic printing plate precursors obtained in Examples 1 to 9 and Comparative Examples 1 and 2 by a microtome or the like, was made conductive and then a photograph of the section was taken by a scanning electron microscope (SEM) and observed. As a result, in Examples 1 to 9, the presence of each lower recording layer dispersion phase was confirmed. The size of the dispersion phase was in a range from 0.05 to 0.55 μm. On the other hand, the lower recording layer in Comparative Examples 1 and 2 was a uniform phase and no dispersion phase was found.

(Evaluation of the Planographic Printing Plate Precursor)

(Evaluation of Developing Latitude)

A test pattern was written image-wise on the resulting planographic printing plate precursors 1 to 9 of the invention and planographic printing plate precursors 10 and 11 obtained in the Comparative Examples, by using Trendsetter manufactured by Creo under the conditions of a beam intensity of 9 w and a drum rotation speed of 150 rpm.

First, the planographic printing precursors 1 to 11 exposed to light in the above condition were developed using PS Processor 940 HII (manufactured by Fuji Photo Film Co., Ltd.) which was provided with a developing solution DT-2 (manufactured by Fuji Photo Film Co., Ltd.) with altered rate of dilution, keeping the solution temperature at 30° C. for a developing time of 12 s. At this time, it was confirmed whether or not contamination and discoloring had been by a recording layer residual film resulting from inferior developing, and the electroconductivity of a developing solution under good development was measured.

The results are shown in Table 3 below. Cases where a difference between the upper limit and the lower limit is large are evaluated as good.

(Evaluation of Scratch Resistance)

The obtained planographic printing plate precursors 1 to 9 obtained in Examples 1 to 9 and planographic printing plate precursors 10 and 11 obtained in Comparative Examples 1 and 2 were respectively rubbed 15 rotations with an abrasion felt CS5 under a load of 250 g by using a rotary abrasion tester (manufactured by TOYOSEIKI Co., Ltd.).

Thereafter, each planographic printing plate precursor was developed using PS Processor 940 HII (manufactured by Fuji Photo Film Co., Ltd.) which was provided with a developing solution DT-2 (diluted in the following ratio: DT-2: water=1:8) (manufactured by Fuji Photo Film Co., Ltd.) with altered rate of dilution, keeping the solution temperature at 30° C. for a developing time of 12 s. The conductivity during developing at this time was 45 mS/cm. The evaluation of scratch resistance was made according to the following standard. A level above and including the level expressed by "B" has no practical problem. The results are shown in Table 3 shown below.

<Evaluation Standard of Scratch Resistance>

A: The optical density of the photosensitive layer of the rubbed portion was not changed at all.

B: A slight change in the optical density of the photosensitive layer of the rubbed portion was visually observed.

C: The optical density of the photosensitive layer of the rubbed portion was dropped to ⅔ or less of that of the non-rubbed portion.

(Image Sharpness)

A test pattern (Staccato 10) was written image-wise on the resulting planographic printing plate precursors 1 to 9 of the invention and planographic printing plate precursors 10 and 11 obtained in Comparative Examples, by using Trendsetter manufactured by Creo under the conditions of a beam intensity of 9 w and a drum rotation speed of 150 rpm. The planographic printing precursors 1 to 11 exposed to light under the above conditions were developed using PS Processor 940 HII (manufactured by Fuji Photo Film Co., Ltd.) which was provided with a developing solution DT-2 (diluted in the following ratio: DT-2:water=1:8) (manufactured by Fuji Photo Film Co., Ltd.), keeping the solution temperature at 30° C. for a developing time of 12 s. The edge parts of the obtained image were observed by an electron microscope (trade name: Hitachi S-800, manufactured by Hitachi Co., Ltd.). The sharpness of the image was evaluated according to the following standard. The results are shown in Table 3 below.

<Evaluation Standard of Sharpness>

A: The side of an image is straight.

B: Some part(s) of the side of the image has chips off

C: Half of the side of the image has chips off.

TABLE 3

| | Planographic printing plate precursor | Electro-conductivity of developing solution for forming an image (mS/cm) | Image sharp-ness | Scratch resistance |
|---|---|---|---|---|
| Example 1 | Planographic printing plate precursor 1 | 41-49 | A | B |
| Example 2 | Planographic printing plate precursor 2 | 41-49 | A | B |
| Example 3 | Planographic printing plate precursor 3 | 41-50 | A | B |
| Example 4 | Planographic printing plate precursor 4 | 41-49 | A | B |
| Example 5 | Planographic printing plate precursor 5 | 41-50 | A | B |
| Example 6 | Planographic printing plate precursor 6 | 42-51 | A | B |
| Example 7 | Planographic printing plate precursor 7 | 41-49 | A | B |
| Example 8 | Planographic printing plate precursor 8 | 41-49 | A | B |
| Example 9 | Planographic printing plate precursor 9 | 41-49 | A | A |

TABLE 3-continued

| | Planographic printing plate precursor | Electro-conductivity of developing solution for forming an image (mS/cm) | Image sharp-ness | Scratch resistance |
|---|---|---|---|---|
| Comparative Example 1 | Planographic printing plate precursor 10 | 43-50 | B | B |
| Comparative Example 2 | Planographic printing plate precursor 11 | 41-47 | B | B |

As is clear from the results of Examples 1 to 9 and Comparative Examples 1 and 2 shown in Table 3, that the planographic printing plate precursors of the invention all had better scratch resistance, without practical problems, and was superior in developing latitude, ensuring a sharp image when compared to the planographic plate precursors of the Comparative Examples.

What is claimed is:

1. A planographic printing plate precursor comprising:

a support; and two or more positive recording layers which are formed on said support and contain a resin and an infrared absorbing agent and exhibit an increase in solubility in an aqueous alkali solution by exposure to infrared laser light;

wherein the positive recording layer closest to the support among these two or more positive recording layers contains at least two types of resins among which at least one type forms substantially a sphere or flattened sphere dispersion phase.

2. The planographic printing plate precursor of claim 1, wherein the positive recording layer closest to said support contains a macromolecular compound which is insoluble in water and soluble in an aqueous alkali solution, the macromolecular compound forming a matrix phase.

3. The planographic printing plate precursor of claim 2, wherein said macromolecular compound forming a matrix phase is incompatible with said resin forming a dispersion phase.

4. The planographic printing plate precursor of claim 2, wherein said macromolecular compound forming a matrix phase has a functional group selected from a phenolic hydroxyl group, a sulfonamide group, or an active imide group.

5. The planographic printing plate precursor of claim 2, wherein said resin(s) forming the dispersion phase comprise macromolecules exhibiting strong interaction with each other.

6. The planographic printing plate precursor of claim 5, wherein said strong interaction is based on hydrogen bonds or ionic bonds between the macromolecules.

7. The planographic printing plate precursor of claim 2, wherein said resin(s) forming a dispersion phase is selected from a urethane type macromolecular compound, a novolac resin, a diazo resin or a polyether.

8. The planographic printing plate precursor of claim 1, wherein said infrared absorbing agent is incorporated into said dispersion phase.

9. A planographic printing plate precursor comprising:

a support; and two or more positive recording layers which are formed on said support and contain a resin and an infrared absorbing agent and exhibit an increase in solubility in an aqueous alkali solution by exposure to infrared laser light;

wherein the positive recording layer closest to the support among these two or more positive recording layers contains at least two types of resins among which at least one type forms a dispersion phase having a maximum size of 0.8 μm or less and an average size of 0.6 μm or less.

10. The planographic printing plate precursor of claim 1, wherein at least said positive recording layer closest to the support further contains an acid generator or a radical generator.

11. The planographic printing plate precursor of claim 10, wherein said acid generator or radical generator is incorporated into said dispersion phase.

12. The planographic printing plate precursor of claim 10, wherein said acid generator or radical generator has high polarity.

13. A planographic printing plate precursor comprising:

a support; and two or more positive recording layers which are formed on said support and contain a polymer binder and a material which acts on the polymer binder to suppress the solubility of the binder in an aqueous alkali solution, the material losing alkali-solubility suppressing ability thereof on said polymer binder by exposure to infrared laser light;

wherein the positive recording layer closest to the support among these two or more positive recording layers contains another resin(s) different from said polymer binder, at least one of said other resin(s) forming a dispersion phase having a maximum size of 0.8 μm or less and an average size of 0.6 μm or less in a matrix phase formed of said macromolecular weight binder.

14. The planographic printing plate precursor of claim 13, wherein said polymer binder forming the matrix phase is incompatible with at least one of said other resin(s) forming the dispersion phase.

15. The planographic printing plate precursor of claim 13, wherein at least one of said other resin(s) forming the dispersion phase comprises macromolecules exhibiting strong interaction with each other.

16. The planographic printing plate precursor of claim 13, wherein said material suppressing the alkali-solubility of the polymer binder is an infrared absorbing agent.

17. The planographic printing plate precursor of claim 16, wherein said infrared absorbing agent is incorporated into said dispersion phase.

18. The planographic printing plate precursor of claim 13, wherein at least said positive recording layer closest to said support further contains an acid generator or a radical generator.

19. The planographic printing plate precursor of claim 18, wherein said acid generator or radical generator is incorporated into said dispersion phase.

* * * * *